US011239302B2

(12) United States Patent
Um et al.

(10) Patent No.: US 11,239,302 B2
(45) Date of Patent: Feb. 1, 2022

(54) DISPLAY PANEL INCLUDING A NON-DISPLAY AREA WITHIN A DISPLAY AREA

(71) Applicant: SAMSUNG DISPLAY CO., LTD., Yongin-si (KR)

(72) Inventors: Nuree Um, Yongin-si (KR); Jaewon Kim, Yongin-si (KR); Hyunae Park, Yongin-si (KR); Hyungjun Park, Yongin-si (KR); Seungwoo Sung, Yongin-si (KR); Junyong An, Yongin-si (KR); Yunkyeong In, Yongin-si (KR); Donghyeon Jang, Yongin-si (KR); Seunghan Jo, Yongin-si (KR); Junyoung Jo, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 16/446,241

(22) Filed: Jun. 19, 2019

(65) Prior Publication Data
US 2020/0176538 A1    Jun. 4, 2020

(30) Foreign Application Priority Data

Nov. 30, 2018    (KR) .................. 10-2018-0153025

(51) Int. Cl.
 *H01L 27/32* (2006.01)
 *H01L 51/52* (2006.01)

(52) U.S. Cl.
CPC ...... *H01L 27/3276* (2013.01); *H01L 51/5253* (2013.01)

(58) Field of Classification Search
CPC ............ H01L 27/3276; H01L 51/5253; H01L 27/3272; H01L 51/5237; H01L 51/52; H01L 27/3258; H01L 51/0096; H01L 27/124; H01L 27/3288; H01L 27/3248; H01L 27/3246; H01L 51/5293; H01L 51/56; H01L 51/5228; H01L 51/5044; H01L 51/5008; H01L 51/5056;
(Continued)

(56) References Cited

U.S. PATENT DOCUMENTS 10,134,826  B2    11/2018  Ka et al.
10,135,025  B2    11/2018  Kim et al.
(Continued)

FOREIGN PATENT DOCUMENTS

KR    10-2017-0059864    5/2017
KR    10-2017-0066767    6/2017
(Continued)

*Primary Examiner* — Mouloucoulaye Inoussa
(74) *Attorney, Agent, or Firm* — F. Chau & Associates, LLC

(57) ABSTRACT

A display panel includes a substrate having a first area, a second area at least partially surrounding the first area, and a third area disposed between the first area and the second area. A plurality of display elements is disposed in the second area. A plurality of wirings detours around an edge of the first area in the third area. A first electrode layer covers at least a portion of the plurality of wirings. A second electrode layer is disposed over the first electrode layer and contacts at least a portion of the first electrode layer.

23 Claims, 25 Drawing Sheets

(58) Field of Classification Search
CPC ..... H01L 51/5212; H01L 33/20; H01L 33/08; H01L 33/54; H01L 33/38; H01L 33/62; G09G 3/3233; Y02P 70/20; Y02E 10/549
USPC ........................................... 257/59, E29.112
See application file for complete search history.

(56) References Cited

U.S. PATENT DOCUMENTS

| | | | |
|---|---|---|---|
| 10,205,122 B2 | 2/2019 | Choi et al. | |
| 2014/0374732 A1* | 12/2014 | Jeong | H01L 27/3262 257/40 |
| 2015/0034921 A1 | 2/2015 | Kim | |
| 2017/0117502 A1* | 4/2017 | Park | H01L 51/56 |
| 2017/0154566 A1* | 6/2017 | Ryoo | G09G 3/3648 |
| 2017/0162637 A1* | 6/2017 | Choi | H01L 27/3246 |
| 2017/0182637 A1 | 6/2017 | Choi et al. | |
| 2017/0237038 A1* | 8/2017 | Kim | H01L 51/5253 257/40 |
| 2017/0288003 A1* | 10/2017 | Kim | H01L 27/124 |
| 2017/0288004 A1* | 10/2017 | Kim | H01L 27/3276 |
| 2017/0294502 A1* | 10/2017 | Ka | H01L 27/3276 |
| 2017/0352707 A1* | 12/2017 | Kim | H01L 27/3209 |
| 2018/0019434 A1* | 1/2018 | Park | H01L 51/56 |
| 2018/0033830 A1* | 2/2018 | Kim | G06F 3/0443 |
| 2018/0151834 A1 | 5/2018 | Kanaya | |
| 2018/0183015 A1 | 6/2018 | Yun et al. | |
| 2018/0261797 A1* | 9/2018 | Lee | H01L 51/525 |
| 2018/0279456 A1 | 9/2018 | Melo | |
| 2019/0304366 A1 | 10/2019 | Ka et al. | |

FOREIGN PATENT DOCUMENTS

| | | |
|---|---|---|
| KR | 10-2017-0096646 | 8/2017 |
| KR | 10-2017-0117291 | 10/2017 |
| KR | 1020170119270 | 10/2017 |

\* cited by examiner

DISPLAY PANEL INCLUDING A NON-DISPLAY AREA WITHIN A DISPLAY AREA

CROSS-REFERENCE TO RELATED APPLICATION

This application claims priority to and the benefit of Korean Patent Application No. 10-2018-0153025, filed on Nov. 30, 2018, in the Korean Intellectual Property Office, the disclosure of which is incorporated by reference herein in its entirety.

TECHNICAL FIELD

The present application relates to a display panel and, more specifically, to a display panel including a non-display area inside of a display area.

DISCUSSION OF THE RELATED ART

Display devices are widely used in a variety of different electronic devices. Display devices have been designed to have a larger functional area and less of an area in which no image is displayed. As the size of the functional area of the display device increases, various other elements have been incorporated into the display device. For example, cameras, sensors, and the like have all been incorporated into the functional area of display devices such as within a notch or cutout.

SUMMARY

A display panel includes a substrate having a first area, a second area at least partially surrounding the first area, and a third area disposed between the first area and the second area. A plurality of display elements is disposed in the second area. A plurality of wirings detours around an edge of the first area in the third area. A first electrode layer covers at least a portion of the plurality of wirings. A second electrode layer is disposed over the first electrode layer and contacts at least a portion of the first electrode layer.

A display panel includes a substrate having a first area, a second area at least partially surrounding the first area, and a third area disposed between the first area and the second area. Each of a plurality of display elements is disposed in the second area and includes a pixel electrode, an opposite electrode, and an emission layer disposed between the pixel electrode and the opposite electrode. A plurality of wirings detours around an edge of the first area in the third area. At least one groove is disposed in the third area. A first electrode layer covers at least a portion of the plurality of wirings. A second electrode layer is disposed over the first electrode layer and contacts at least a portion of the first electrode layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
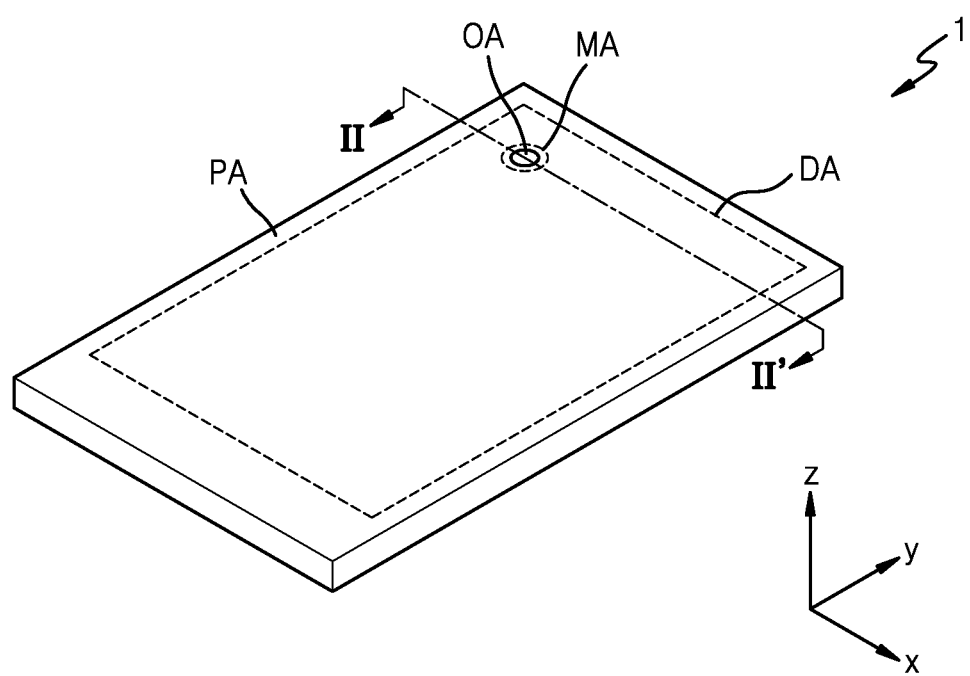
FIG. 1 is a perspective view illustrating a display device according to an exemplary embodiment of the present disclosure.

As the present disclosure allows for various changes and numerous embodiments, exemplary embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure. In the description of the present disclosure, certain detailed explanations of the related art are omitted when it is deemed that they may unnecessarily obscure the essence of the present disclosure.

While such terms as "first," "second," etc., may be used to describe various components, such components must not be limited to the above terms. The above terms are used only to distinguish one component from another.

It will be understood that when a layer, region, or component is referred to as being "formed on" another layer, region, or component, it can be directly or indirectly formed on the other layer, region, or component. For example, for example, intervening layers, regions, or components may be present.

In the following examples, the x-axis, the y-axis and the z-axis are not limited to three axes of the Cartesian coordinate system, and may be interpreted in a broader sense. For example, the x-axis, the y-axis, and the z-axis may be perpendicular to one another, or may represent different directions that are not perpendicular to one another.

Hereinafter, embodiments are described with reference to the drawings. In making description with reference to the drawings, like reference numerals may be used for substantially like or corresponding elements and repeated descriptions thereof are omitted. In the drawings, thicknesses of various layers and elements may be exaggerated for convenience of explanation.

FIG. 1 is a perspective view illustrating a display device 1 according to an exemplary embodiment of the present disclosure.

Figure 2:
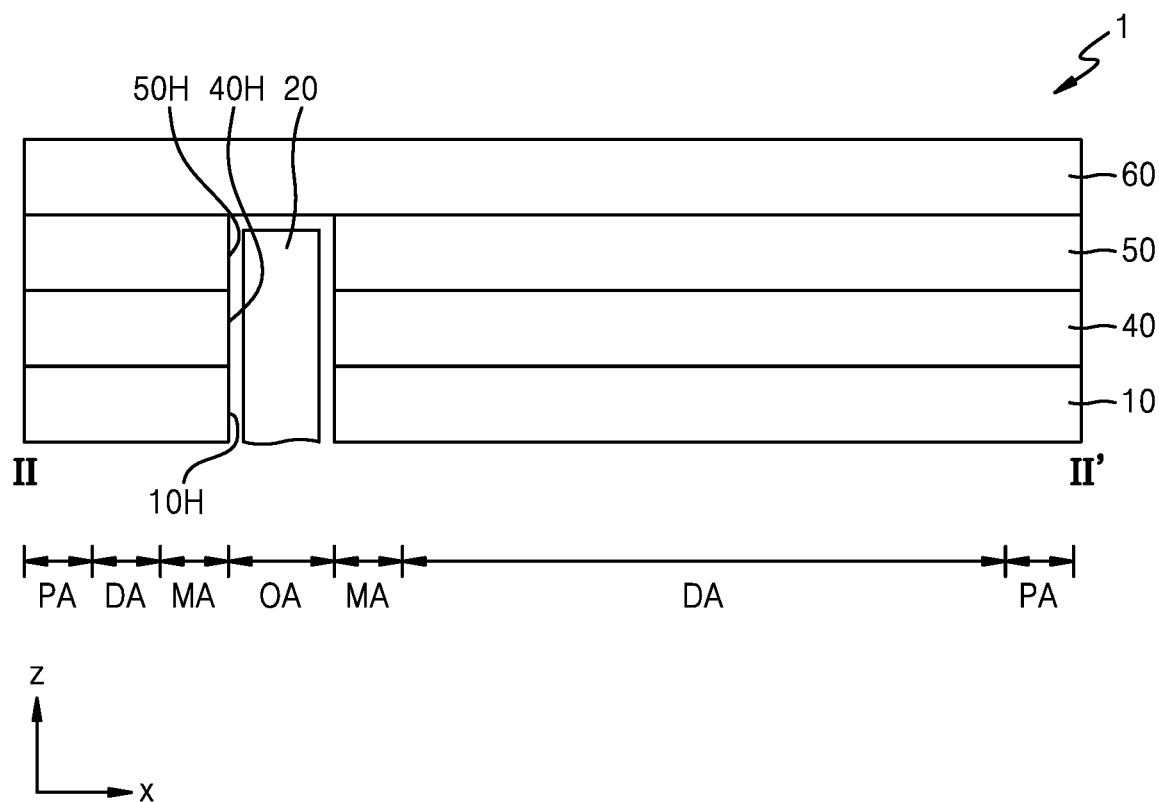
FIG. 2 is a cross-sectional view illustrating a display device according to an exemplary embodiment of the present disclosure.

Referring to FIG. 1, the display device 1 includes a first area OA and a second area DA, which is a display area, that at least partially surrounds the first area OA. The display device 1 may display a predetermined image by using light emitted from a plurality of pixels arranged in the second area DA. It is shown in FIG. 1 that one first area OA is arranged inside the second area DA, and the first area OA may be entirely surrounded by the second area DA. The first area OA may be an area in which a component, as described below with reference to FIG. 2, is arranged.

A third area MA may be arranged as an intermediate area between the first area OA and the second area DA, which is the display area. The second area DA may be surrounded by an outer area PA, which is a fourth area. The third area MA and the outer area PA may be a kind of non-display area or bezel in which pixels are not arranged. The third area MA may be entirely surrounded by the second area DA, and the second area DA may be entirely surrounded by the outer area PA.

Though an organic light-emitting display device is exemplarily described as the display device 1 according to an embodiment described below, the display device 1 is not limited thereto. For example, various types of display devices such as an inorganic light-emitting display and a quantum dot light-emitting display may be used.

Though it is shown in FIG. 1 that one first area OA is provided and the one first area OA is approximately circular, the present disclosure is not limited thereto. The number of first areas OA may be two or more, and a shape of each of the first areas OA may be a circular shape, an elliptical shape, a polygonal shape, a star shape, or a diamond shape and may be variously modified.

Figure 3:
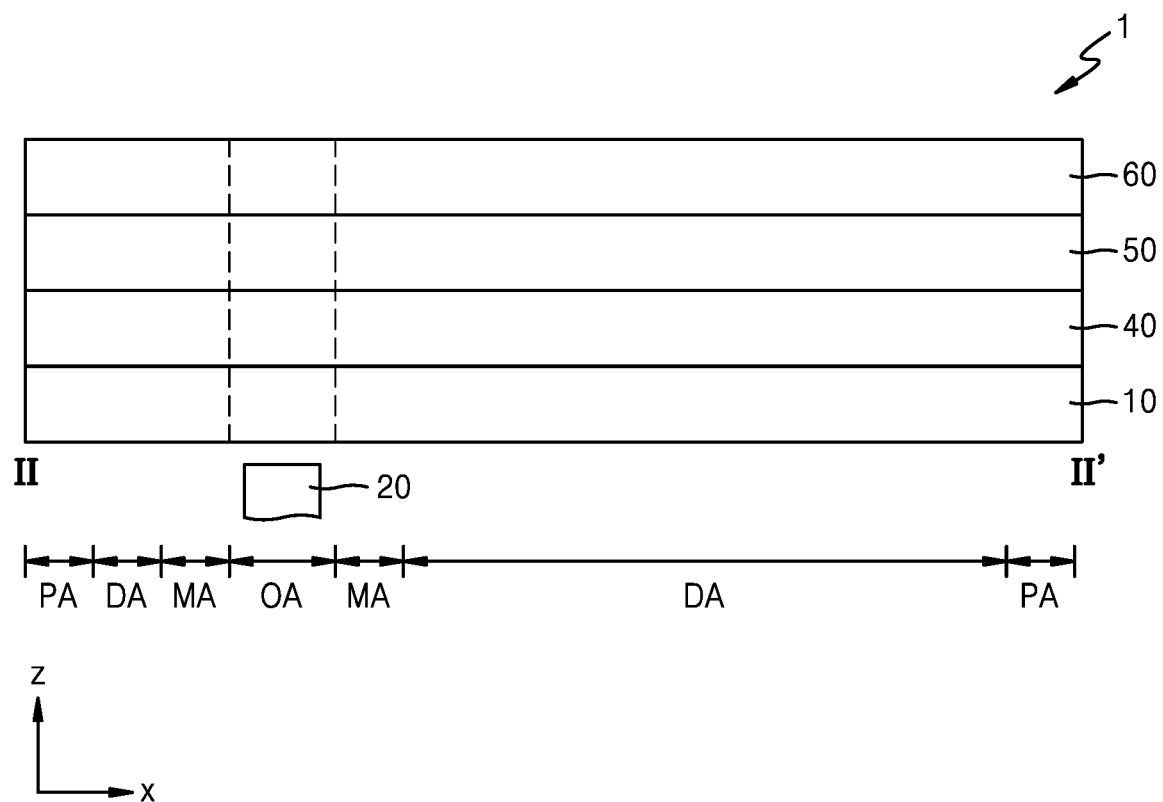
FIG. 3 is a cross-sectional view illustrating a display device according to an exemplary embodiment of the present disclosure.

FIG. 2 is a cross-sectional view illustrating the display device 1 according to an exemplary embodiment of the present disclosure, taken along line II-II' of FIG. 1, and FIG. 3 is a cross-sectional view of the display device 1 according to an exemplary embodiment of the present disclosure.

Referring to FIG. 2, the display device 1 may include a display panel 10, an input sensing layer 40, and an optical functional layer 50 arranged on the display panel 10. These layers may be covered by a window 60. The display device 1 may be one of various types of electronic devices such as mobile phones, notebook computers, and smartwatches.

The display panel 10 may display an image. The display panel 10 includes pixels arranged in the second area DA (e.g. the display area). Each of the pixels may include a display element and a pixel circuit connected thereto. The display element may include an organic light-emitting diode, an inorganic light-emitting diode, or a quantum dot light-emitting diode.

The input sensing layer 40 obtains coordinate information corresponding to an external input, for example, a touch event. The input sensing layer 40 may include a sensing electrode (or a touch electrode) and signal lines connected to the sensing electrode. The input sensing layer 40 may be arranged on the display panel 10. The input sensing layer 40 may sense an external input using a mutual cap method and/or a self cap method.

The input sensing layer 40 may be directly formed on the display panel 10 or may be formed separately and then coupled thereto using an adhesive layer such as an optical clear adhesive (OCA). For example, the input sensing layer 40 may be formed after a process of forming the display panel 10. In this case, the adhesive layer might not be arranged between the input sensing layer 40 and the display panel 10. Though FIG. 2 shows that the input sensing layer 40 is arranged between the display panel 10 and the optical functional layer 50, the input sensing layer 40 may be alternately arranged on the optical functional layer 50.

The optical functional layer 50 may include a reflection prevention layer. The reflection prevention layer may reduce reflectivity of light (e.g. external light) incident from the outside toward the display panel 10 through the window 60. The reflection prevention layer may include a retarder and a polarizer. The retarder may include a film-type retarder or a liquid crystal-type retarder. The retarder may include $\lambda/2$ retarder (e.g. half wave plate) and/or a $\lambda/4$ retarder (e.g. quarter wave plate). The polarizer may include a film-type polarizer or a liquid crystal-type polarizer. The film-type polarizer may include a stretchable synthetic resin film, and the liquid crystal-type polarizer may include liquid crystals arranged in a predetermined arrangement. Each of the retarder and the polarizer may further include a protective film. The retarder and the polarizer themselves or their protective films may be defined as a base layer of the reflection prevention layer.

In an exemplary embodiment of the present disclosure, the reflection prevention layer may include a black matrix and color filters. The color filters may be arranged by taking into account colors of light emitted respectively from pixels of the display panel 10. In an exemplary embodiment of the present disclosure, the reflection prevention layer may include a destructive interference structure. The destructive interference structure may include a first reflection layer and a second reflection layer respectively arranged in different layers. First reflected light and second reflected light respectively reflected by the first reflection layer and the second reflection layer may create destructive-interference and thus reflectivity of external light may be reduced.

The optical functional layer 50 may include a lens layer. The lens layer may increase emission efficiency of light emitted from the display panel 10 or reduce color deviation of the light. The lens layer may include a layer having a concave or convex lens shape and/or include a plurality of layers respectively having different refractive indexes. The optical functional layer 50 may include both the reflection prevention layer and the lens layer or include one of the reflection prevention layer and the lens layer.

The display panel 10, the input sensing layer 40, and/or the optical functional layer 50 may each include an opening. FIG. 2 shows that the display panel 10, the input sensing layer 40, and the optical functional layer 50 respectively include first to third openings 10H, 40H, and 50H and that the first to third openings 10H, 40H, and 50H thereof overlap each other and correspond to each other so as to form a singular opening. The first to third openings 10H, 40H, and 50H are located to correspond to the first area OA. According to an exemplary embodiment of the present disclosure, at least one of the display panel 10, the input sensing layer 40, and the optical functional layer 50 might not include an opening. For example, one or two of the display panel 10, the input sensing layer 40, and the optical functional layer 50 might not include an opening. Alternatively, as shown in FIG. 3, none of the display panel 10, the input sensing layer 40, and the optical functional layer 50 might include an opening.

As described above, the first area OA may be a kind of component area (e.g. a sensor area, a camera area, a speaker area, etc.) in which a component 20 for adding various functions to the display device 1 is located. As shown in FIG. 2, the component 20 may be located in the first to third openings 10H, 40H, and 50H. Alternatively, as shown in FIG. 3, the component 20 may be arranged below the display panel 10.

The component 20 may include an electronic element. For example, the component 20 may include an electronic element that makes use of light and/or sounds. For example, the component may be a sensor such as an infrared sensor that emits and/or receives light, a camera that receives light and captures an image, a sensor that outputs and senses light or sounds to measure a distance or recognize a fingerprint, a small lamp that outputs light, or a speaker that outputs sounds. An electronic element that uses light may use light in various wavelength bands such as visible light, infrared light, and ultraviolet light. In an exemplary embodiment of the present disclosure, the first area OA may be understood as a transmission area through which light and/or sound, which are output from the component 20 to the outside or propagate toward the electronic element from the outside, may pass.

According to an exemplary embodiment of the present disclosure, in the case where the display device 1 is used as a smartwatch or an instrument panel for an automobile, the component 20 may be a member including a needle of a clock or a needle, etc. indicating predetermined information (e.g. the velocity of a vehicle, etc.). In the case where the display device 1 includes a needle of a clock or an instrument panel for an automobile, the component 20 may be exposed to the outside through the window 60, which may include an opening corresponding to the first area OA.

As described above, the component 20 may include element(s) related to a function of the display panel 10 or an element such as an accessory that increases an esthetic sense of the display panel 10. Though not shown in FIGS. 2 and 3, a layer including an OCA, etc. may be located between the window 60 and the optical functional layer 50.

Figure 4A:
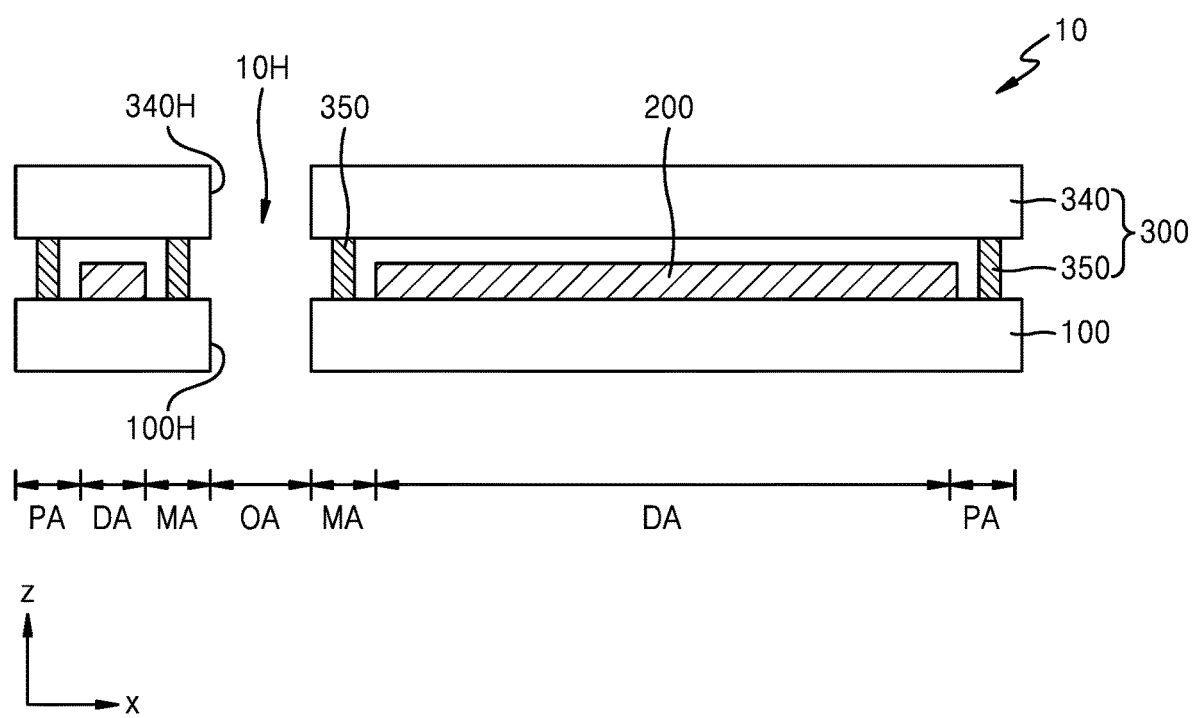
FIGS. 4A to 4E are cross-sectional views illustrating a display panel according to an exemplary embodiment of the present disclosure.
Figure 4B:
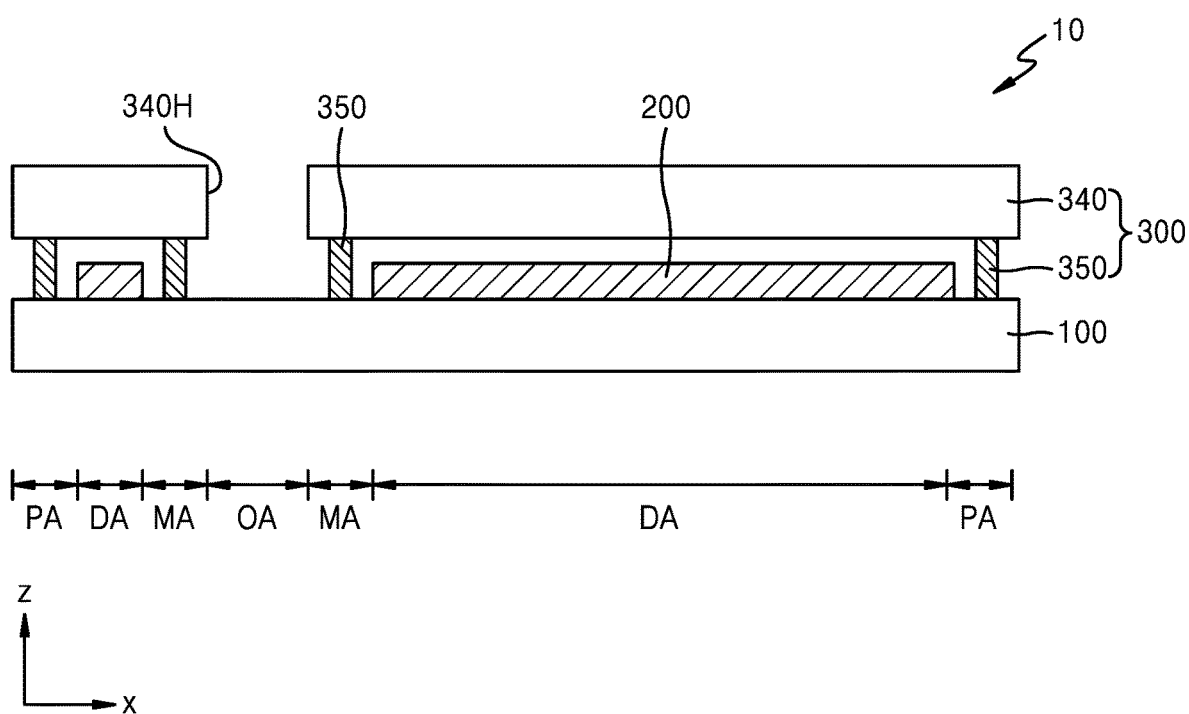
Figure 4C:
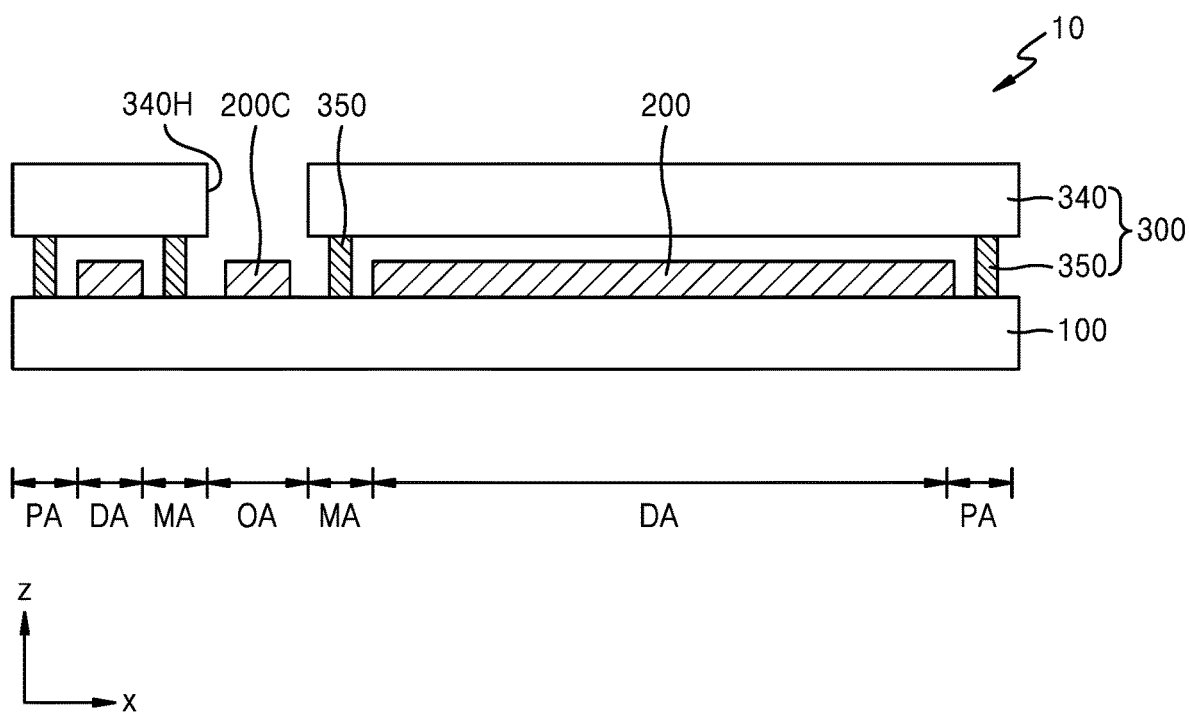

FIGS. 4A to 4C are cross-sectional views of the display panel 10 according to an exemplary embodiment of the present disclosure.

Referring to FIGS. 4A to 4C, the display panel 10 includes a display element layer 200 (also referred to as a display layer) arranged on a substrate 100. The substrate 100 may include a glass material or a polymer resin. For example, the substrate 100 may include a glass material containing $SiO_2$ as a main component thereof or may include a resin such as a reinforced plastic.

The display element layer 200 is disposed to correspond to the second area DA and includes a plurality of pixels. The display element layer 200 includes a pixel circuit corresponding to each pixel and a display element electrically connected to the pixel circuit. The pixel circuit may include a thin film transistor and a storage capacitor, and the display element may include an organic light-emitting diode OLED.

The display element layer 200 includes, as an encapsulation member 300 (also referred to as a thin-film encapsulation layer), an encapsulation substrate 340 facing the substrate 100. A sealing material 350 is arranged between the substrate 100 and the encapsulation substrate 340. The sealing material 350 surrounds the display element layer 200 between the substrate 100 and the encapsulation substrate 340. For example, the sealing material 350 may surround a first edge (also referred to as an inner edge) of the display element layer 200 in the third area MA and surround a second edge (also referred to as an outer edge) of the display element layer 200 in the outer area PA. When viewed in a direction perpendicular to a main surface, the first area OA may be entirely surrounded by the sealing material 350, and the second edge of the display element layer 200 may be also entirely surrounded by the sealing material 350.

The display panel 10 may include the first opening 10H corresponding to the first area OA. With regard to this, it is shown in FIG. 4A that the substrate 100 and the encapsulation substrate 340 respectively include through holes 100H and 340H corresponding to the first area OA. The display element layer 200 may also include a through hole 10H corresponding to the first area OA.

According to an exemplary embodiment of the present disclosure, as shown in FIG. 4B, the encapsulation substrate 340 may include a through hole 340H corresponding to the first area OA, but the substrate 100 might not include a through hole. The display element layer 200 may include a through hole corresponding to the first area OA.

In this case, as shown in FIG. 4C, an auxiliary display element layer 200C may be located in the first area OA. The auxiliary display element layer 200C may include a display element that has a structure and/or operates in a method different from that of an element of a display element layer 200. According to an exemplary embodiment of the present disclosure, the display element layer 200 may include pixels, each including an active-type organic light-emitting diode, and the auxiliary display element layer 200C may include pixels, each including an inactive-type organic light-emitting diode. In the case where the auxiliary display element layer 200C includes a display element of an active-type organic light-emitting diode, there might not be elements constituting a pixel circuit below the relevant display element. For example, there might not be a transistor or a storage capacitor arranged in each pixel below the auxiliary display element layer 200C in a pixel circuit.

According to an exemplary embodiment of the present disclosure, the auxiliary display element layer 200C may include a display element of the same type (e.g. an active-type organic light-emitting diode) as the display element layer 200, but a pixel circuit therebelow may be different. For example, the pixel circuit (e.g. a pixel circuit including a light-blocking layer between a substrate and a transistor, etc.) below the auxiliary display element layer 200C may have a structure different from that of the pixel circuit below the display element layer 200. Alternatively, display elements of the auxiliary display element layer 200C may operate in response to a control signal different from a control signal of display elements of the display element layer 200.

A component (e.g. an infrared sensor, etc.) that does not require a relatively high transmittance may be arranged in the first area OA in which the auxiliary display element layer 200C is arranged. Referring to FIGS. 4C and 5D, the display element layer 200A/200 may be understood as a component area and an auxiliary display area. The display element layer 200A/200 may be covered by the thin-film encapsulation layer 300. An inorganic layer 520 may cover the thin-film encapsulation layer 300. The inorganic layer 520 may further extend than the thin-film encapsulation layer 300 in the third area MA. The inorganic layer 520 may also cover the auxiliary display element layer 200C in the first area OA. An encapsulation layer may be arranged between the auxiliary display element layer 200C and the inorganic layer 520, the encapsulation layer covering the auxiliary display element layer 200C. The encapsulation layer on the auxiliary display element layer 200C may have a structure that is the same as or different from a structure of the thin-film encapsulation layer 300 on the display element layer 200A/200.

Figure 4D:
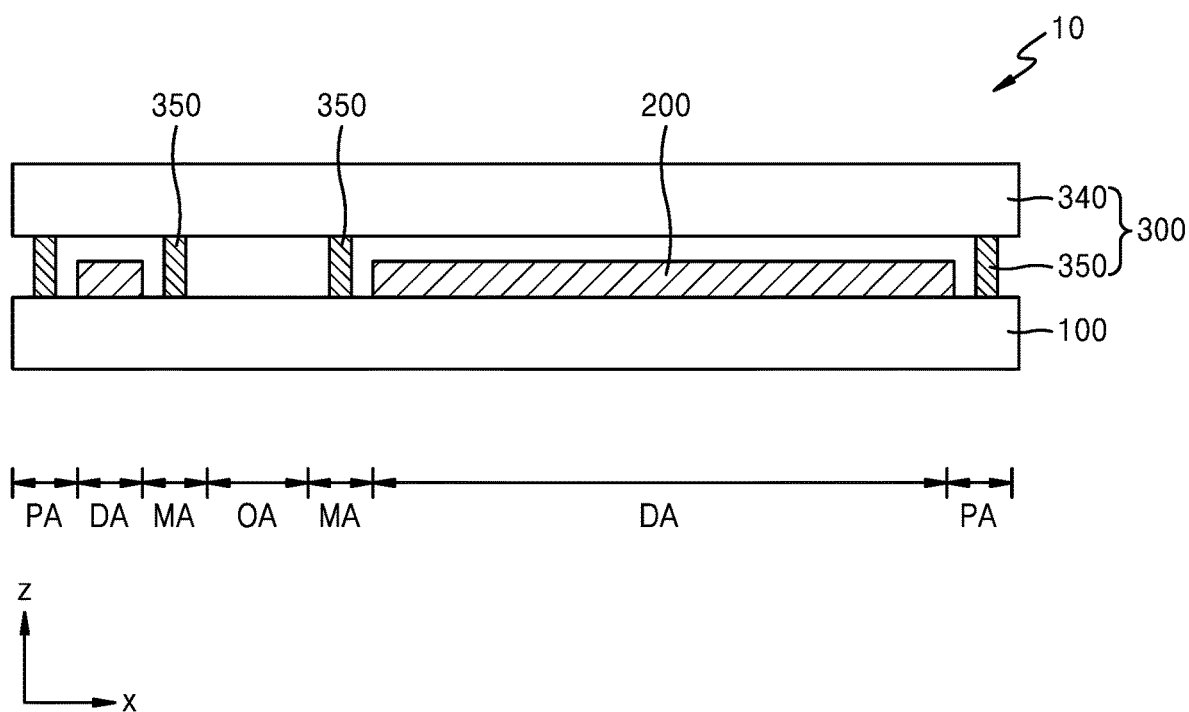

According to an exemplary embodiment of the present disclosure, as shown in FIG. 4D, each of the substrate 100 and the encapsulation substrate 340 might not include a through hole corresponding to the first area OA. The display element layer 200 may include a through hole corresponding to the first area OA. According to an exemplary embodiment of the present disclosure, the sealing material 350 of the display panel 10 of FIG. 3C arranged in the third area MA may be omitted. Also, the display element layer 200 might not include a through hole corresponding to the first area OA. Since the component 20 (see FIG. 2) that does not require a relatively high transmittance may be arranged in the first area OA, the first area OA may be used as a transmission area that transmits light used by the component 20. Even when the display element layer 200 does not include a through hole corresponding to the first area OA, a portion of the display element layer 200 that corresponds to the first area OA may transmit light by not including elements (e.g. a transistor, a storage capacitor, a wiring, etc.) constituting a pixel circuit PC (see FIGS. 9 and 10).

Figure 4E:
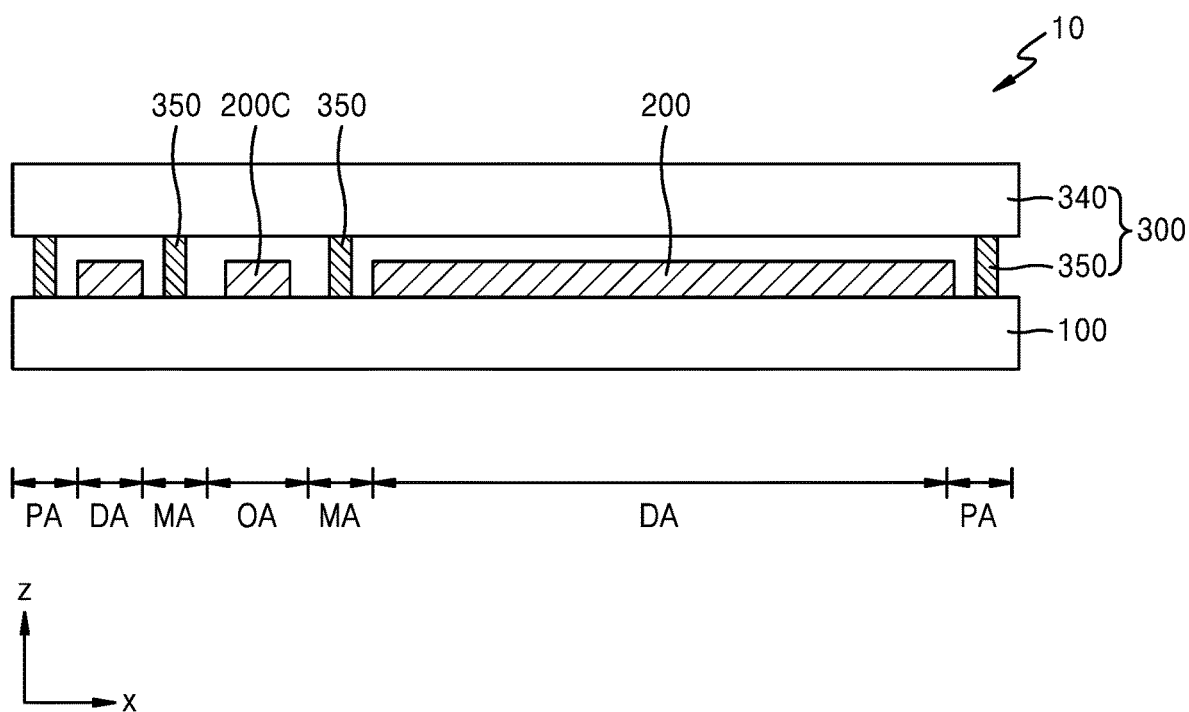

In this case, as shown in FIG. 4E, the auxiliary display element layer 200C may be disposed in the first area OA, and since detailed description thereof has been made with reference to FIG. 4C, repeated description thereof is omitted and it may be assumed that those features that are not described in detail herein are at least similar to corresponding elements that have already been described.

FIGS. 5A to 5D are cross-sectional views of the display panel 10 according to an exemplary embodiment of the present disclosure.

Figure 5A:
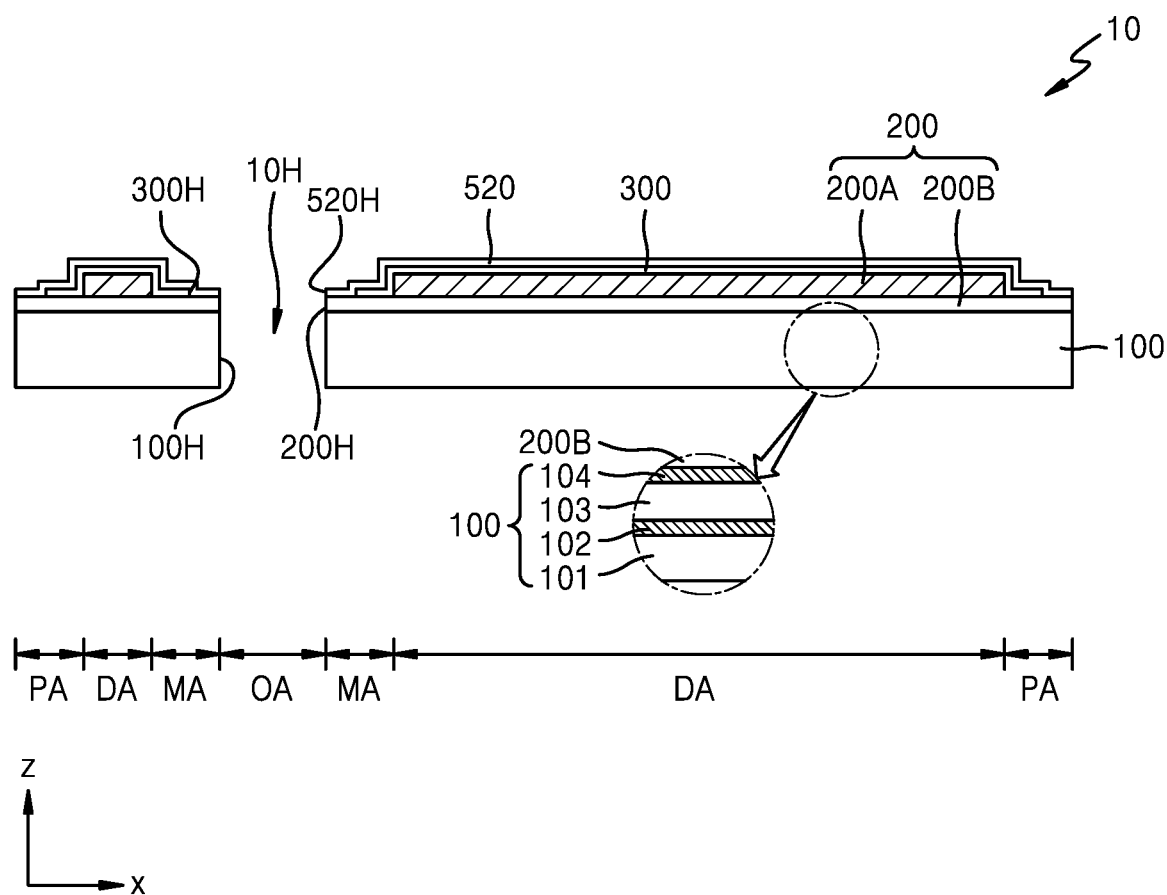
FIGS. 5A to 5D are cross-sectional views illustrating a display panel according to an exemplary embodiment of the present disclosure.

Referring to FIG. 5A, the display panel 10 includes the display layer 200 disposed on the substrate 100. The substrate 100 may include a glass material or a polymer resin. The substrate 100 may be formed of multiple layers. For example, as shown in an enlarged view of FIG. 5A, the substrate 100 may include a first base layer 101, a first barrier layer 102, a second base layer 103, and a second barrier layer 104.

Each of the first and second base layers 101 and 103 may include a polymer resin. For example, the first and second base layers 101 and 103 may each include a polymer resin such as polyethersulfone (PES), polyarylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose triacetate (TAC), and/or cellulose acetate propionate (CAP). The polymer resin may be transparent.

Each of the first and second barrier layers 102 and 104 may include a barrier layer configured to prevent penetration of external foreign substances and include a single layer or a multi-layer including an inorganic material such as SiNx and/or SiOx.

The display layer 200 includes a plurality of pixels. The display layer 200 may include the display element layer 200A including a display element disposed in each pixel, and the pixel circuit layer 200B including a pixel circuit and insulating layers disposed in each pixel. Each pixel circuit may include a thin film transistor and a storage capacitor. Each display element may include an organic light-emitting diode OLED.

The display elements of the display layer 200 may be covered by an encapsulation member such as the thin-film encapsulation layer 300. The inorganic layer 520 is disposed on the thin-film encapsulation layer 300. The inorganic layer 520 may cover ends of the thin-film encapsulation layer 300 in the third area MA. The inorganic layer 520 may further extend toward the first area OA than an end of the thin-film encapsulation layer 300 in the third area MA and contact a layer disposed under the end of the thin-film encapsulation layer 300. The inorganic layer 520 may include an inorganic insulating material, and the inorganic insulating material may include, for example, silicon nitride, silicon oxide, and silicon oxynitride.

In the case where the display panel 10 includes the substrate 100 and the thin-film encapsulation layer 300, each being a multi-layer, the flexibility of the display panel 10 may be increased. The display panel 10 may include the first opening 10H that passes through the display panel 10. The first opening 10H may be disposed in the first area OA. In this case, the first area OA may be a kind of opening area.

It is shown in FIG. 5A that the substrate 100, the thin-film encapsulation layer 300, and the inorganic layer 520 respectively include through holes 100H, 300H, and 520H, each corresponding to the first opening 10H. The display layer 200 may include a through hole 200H corresponding to the first area OA.

Figure 5B:
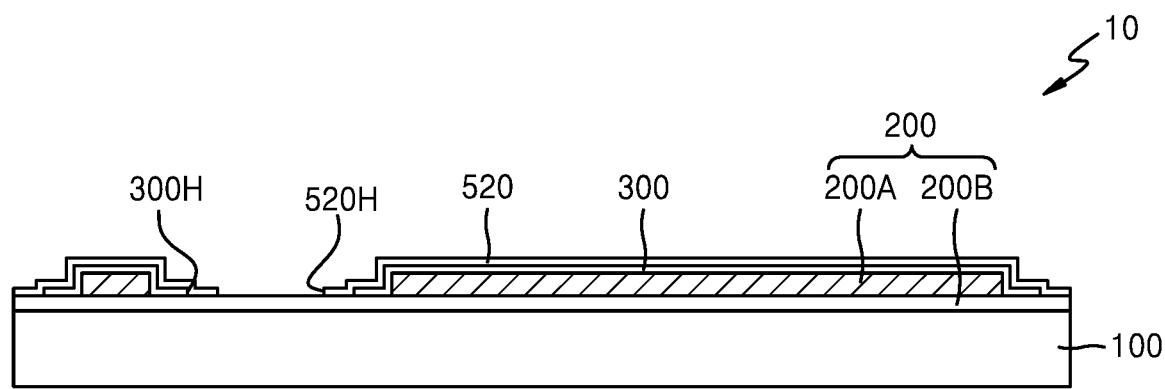

According to an exemplary embodiment of the present disclosure, as shown in FIG. 5B, the substrate 100 might not include a through hole corresponding to the first area OA. The display element layer 200A might not be disposed in the first area OA, and the pixel circuit layer 200B may be disposed in the first area OA. The thin-film encapsulation layer 300 may include the through hole 300H corresponding to the first area OA. As shown in FIG. 5B, the inorganic layer 520 may include the through hole 520H corresponding to the first area OA, or as shown in FIG. 5C, the inorganic layer 520 may cover the first area OA while not including the through hole.

Figure 5C:
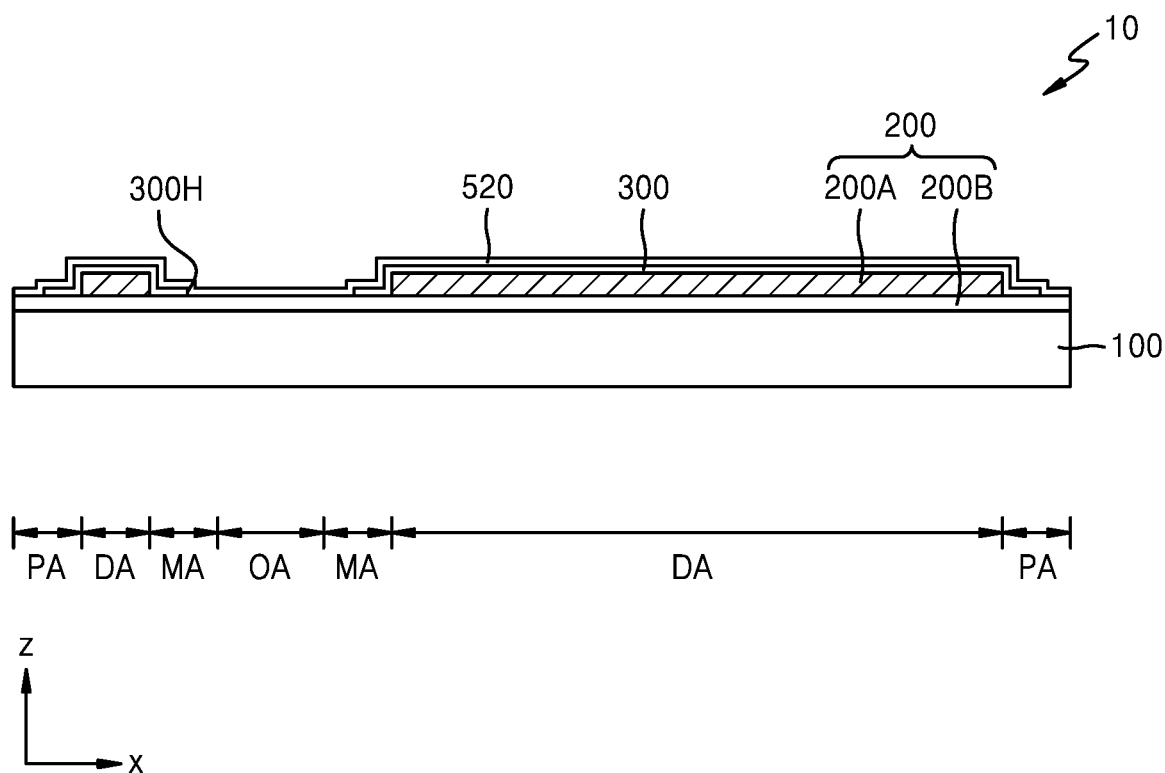
Figure 5D:
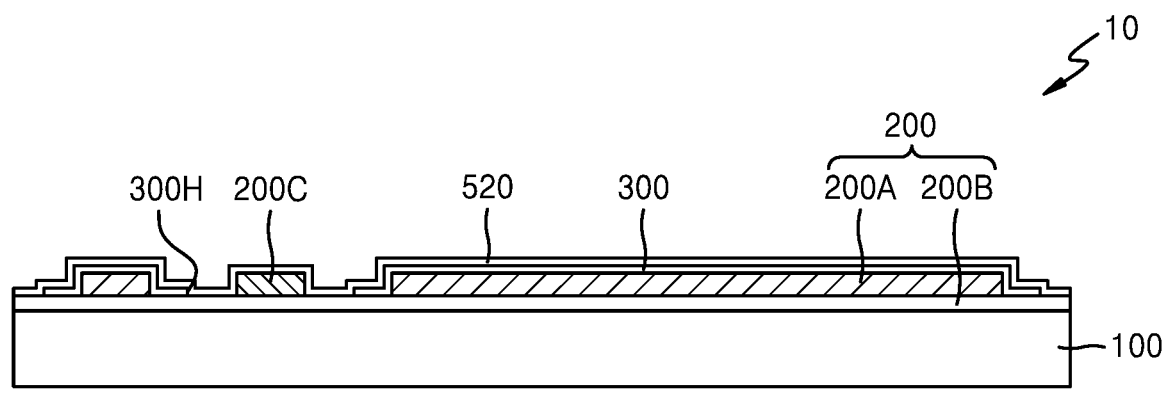

Though it is shown in FIGS. 5A to 5C that the display element layer 200A is not disposed in the first area OA, the present disclosure is not limited thereto. According to an exemplary embodiment of the present disclosure, as shown in FIG. 5D, the auxiliary display element layer 200C may be disposed in the first area OA. Since specific description of the auxiliary display element layer 200C has been made with reference to FIG. 4C, repeated description thereof is omitted and it may be assumed that those features that are not described in detail herein are at least similar to corresponding elements that have already been described.

Figure 6:
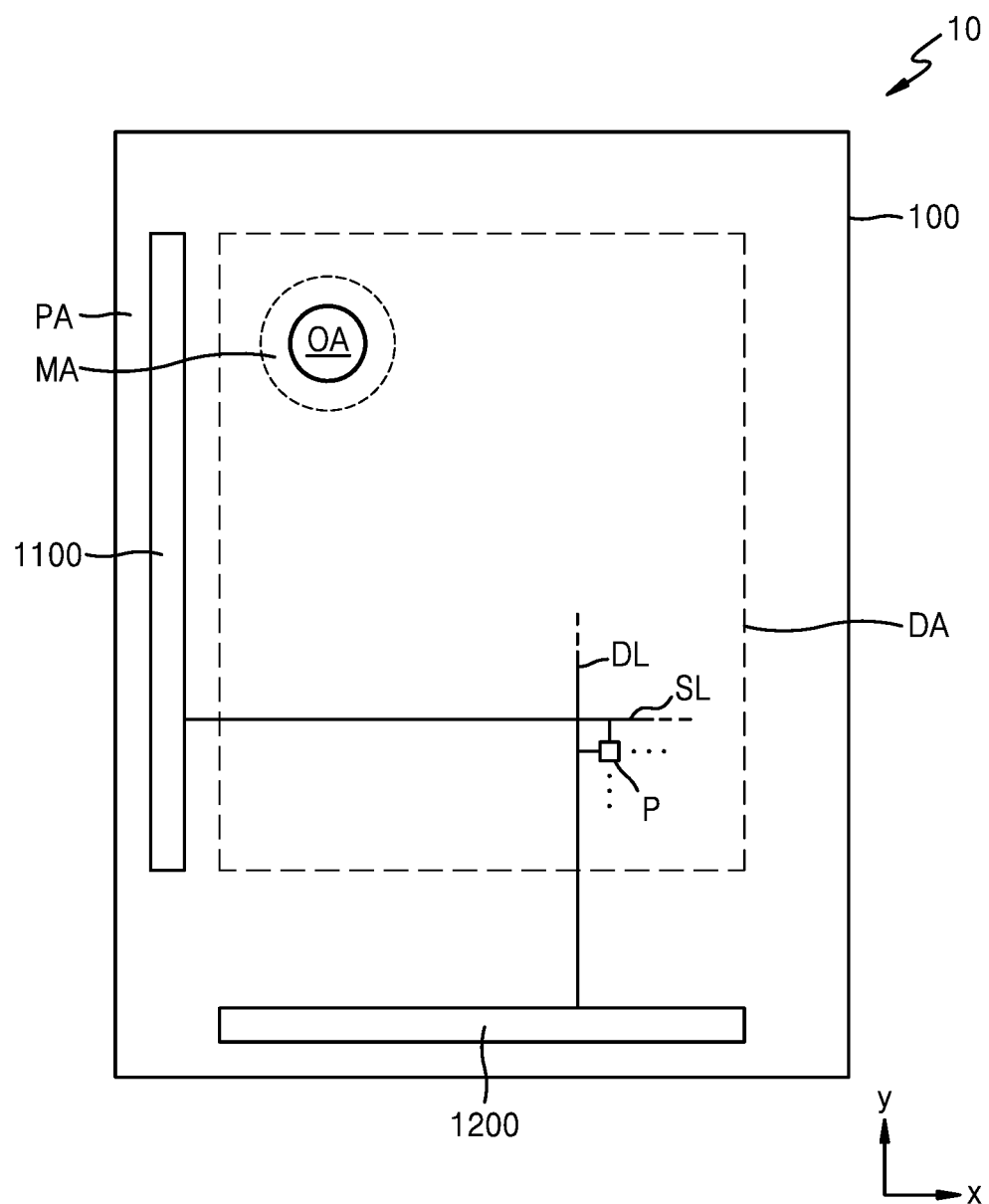
FIG. 6 is a plan view illustrating a display panel according to an exemplary embodiment of the present disclosure.
Figure 7:
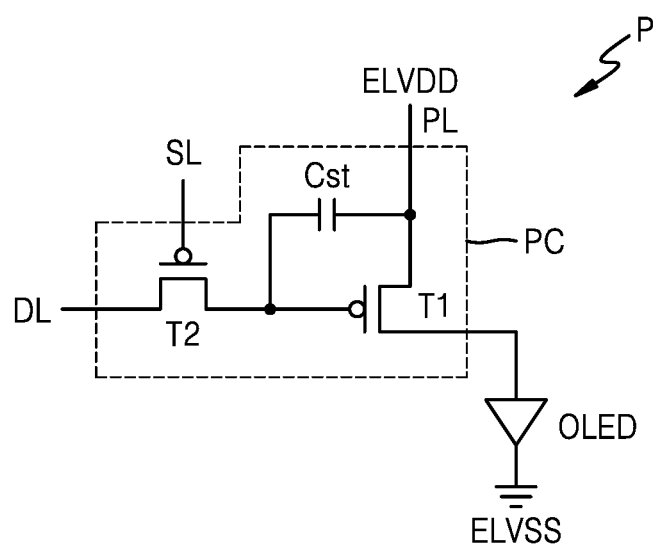
FIG. 7 is an equivalent circuit diagram illustrating one of the pixels of a display panel according to an exemplary embodiment of the present disclosure.

FIG. 6 is a plan view of the display device 1 according to an exemplary embodiment of the present disclosure, and FIG. 7 is an equivalent circuit diagram illustrating one of pixels of the display panel 10 according to an exemplary embodiment of the present disclosure.

Referring to FIG. 6, the display panel 10 may include the second area DA, the first area OA, the third area MA, and the outer area PA. FIG. 6 may be understood as a figure of the substrate 100 of the display panel 10. For example, the substrate 100 may be understood to include the second area DA, the first area OA, the third area MA, and the outer area PA.

The display panel 10 includes a plurality of pixels P disposed in the second area DA. As shown in FIG. 7, each pixel P includes a pixel circuit PC and an organic light-emitting diode OLED as a display element connected to the pixel circuit PC. The pixel circuit PC may include a first thin film transistor T1, a second thin film transistor T2, and a storage capacitor Cst. Each pixel P may emit, for example, red, green, or blue light, or red, green, blue, or white light through the organic light-emitting diode OLED.

The second thin film transistor T2 is a switching thin film transistor and is connected to a scan line SL and a data line DL, and may transfer a data voltage input from the data line DL to the first thin film transistor T1 in response to a switching voltage input from the scan line SL. The storage capacitor Cst may be connected to the second thin film transistor T2 and a driving voltage line PL and may store a voltage corresponding to a difference between a voltage transferred from the second thin film transistor T2 and a first power voltage ELVDD supplied from the driving voltage line PL.

The first thin film transistor T1 is a driving thin film transistor and may be connected to the driving voltage line PL and the storage capacitor Cst and may control a driving current flowing through the organic light-emitting diode OLED from the driving voltage line PL in response to the voltage value stored in the storage capacitor Cst. The organic light-emitting diode OLED may emit light having predetermined brightness by using the driving current. An opposite electrode (e.g. a cathode) of the organic light-emitting diode OLED may receive a second power voltage ELVSS.

Though it is shown in FIG. 7 that the pixel circuit PC includes two thin film transistors and one storage capacitor, the present disclosure is not limited thereto. The number of thin film transistors and the number of storage capacitors may be variously modified depending on a design of the pixel circuit PC.

Referring to FIG. 6 again, the third area MA may surround the first area OA. The third area MA is an area in which a display element such as the organic light-emitting diode OLED is not disposed. Signal lines configured to provide a signal to pixels P disposed around the first area OA may pass across the third area MA. A scan driver 1100 configured to provide a scan signal to each pixel P, a data driver 1200 configured to provide a data signal to each pixel P, main power wirings configured to provide first and second power voltages, etc. may be disposed in the outer area PA. Though it is shown in FIG. 6 that the data driver 1200 is adjacent to one side of the substrate 100, the data driver 1200 may be disposed on a flexible printed circuit board (FPCB) electrically connected to a pad disposed on one side of the display panel 10 according to an exemplary embodiment of the present disclosure.

Figure 8:
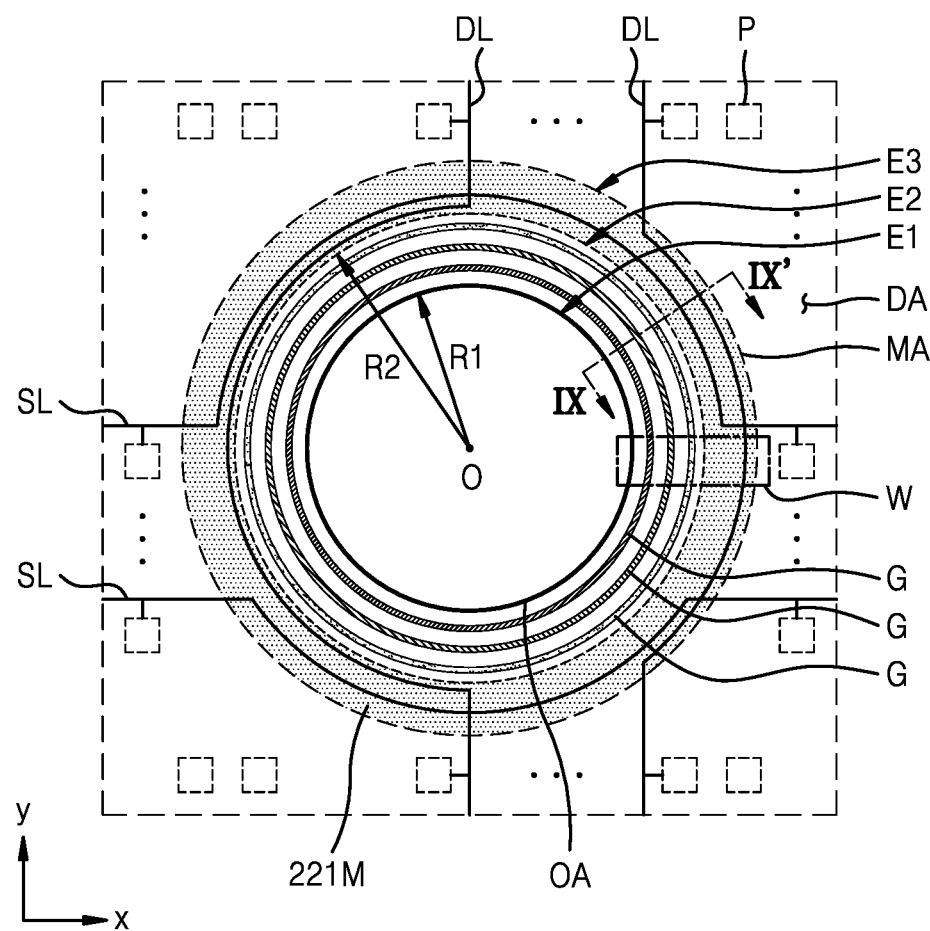
FIG. 8 is a plan view illustrating an element arranged in a first area and an intermediate area of a display panel according to an exemplary embodiment of the present disclosure.
Figure 9:
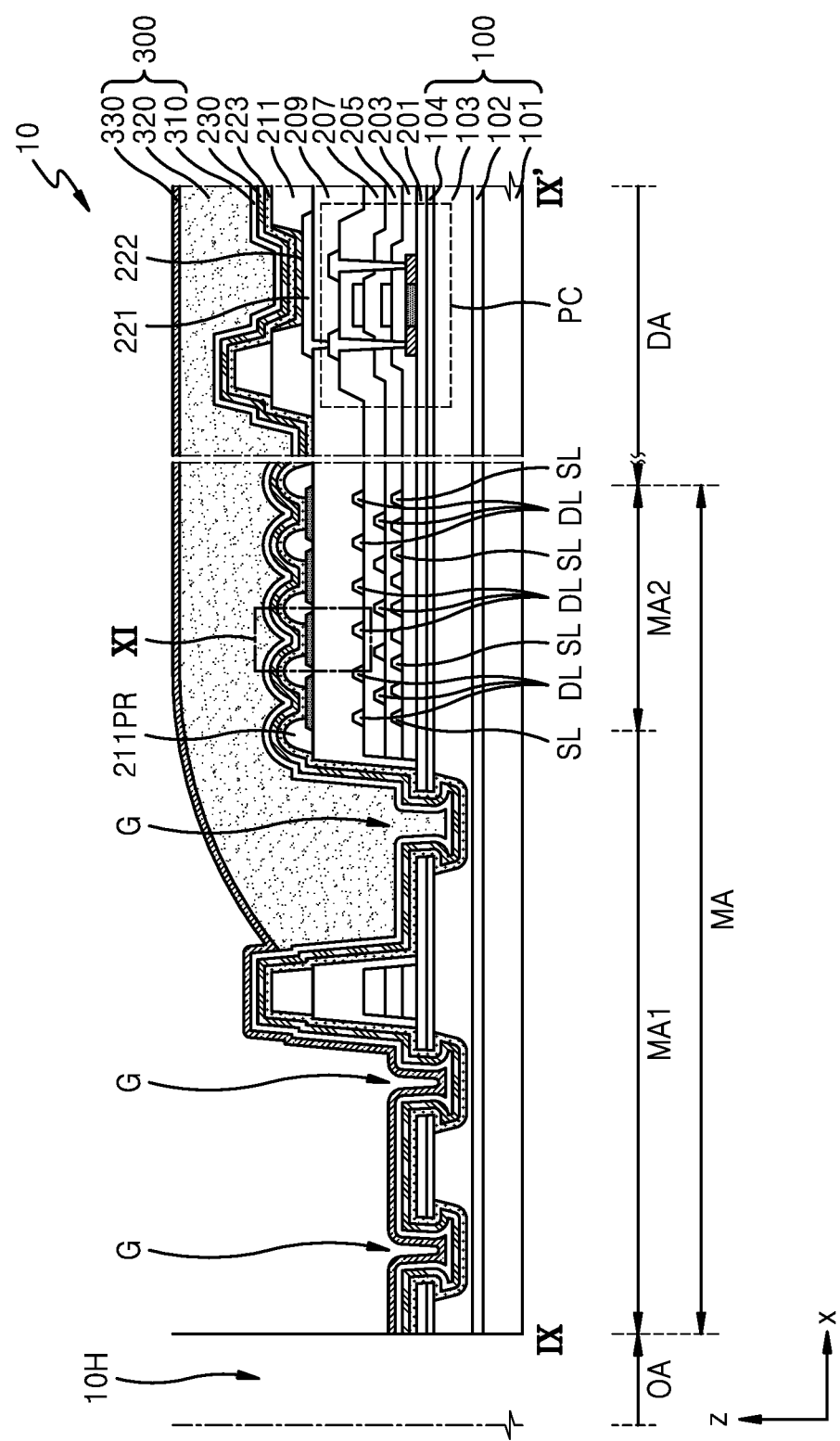
FIG. 9 is a cross-sectional view taken along line IX-IX' of FIG. 8.
Figure 10:
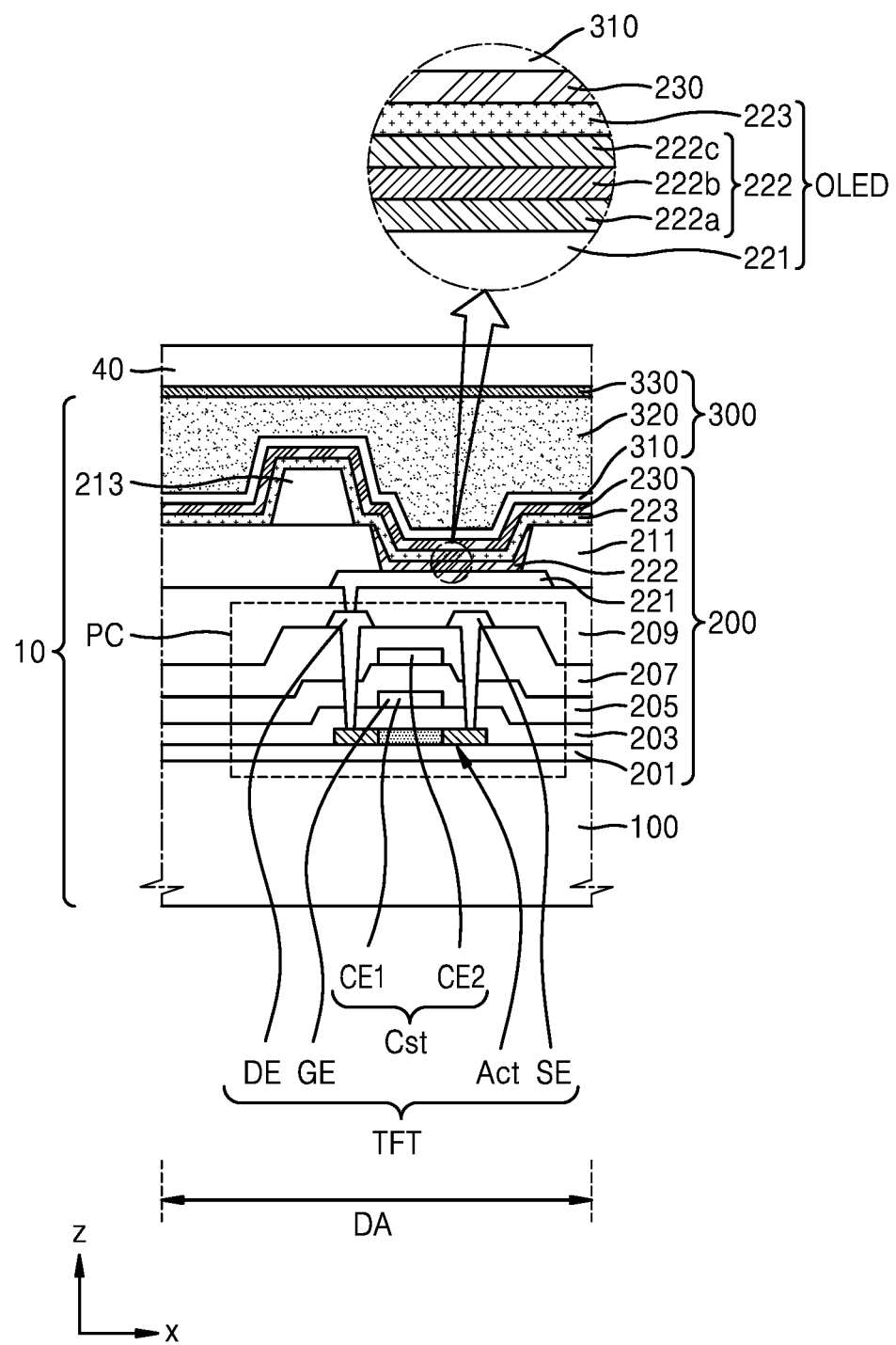
FIG. 10 is an enlarged cross-sectional view illustrating a region of the display panel of FIG. 9.

FIG. 8 is a plan view illustrating an element disposed in the first area OA and the intermediate area of the display panel 10 according to an exemplary embodiment of the present disclosure, FIG. 9 is a cross-sectional view taken along line IX-IX' of FIG. 8, and FIG. 10 is an enlarged cross-sectional view of a region of the display panel 10 of FIG. 9.

Referring to FIGS. 8 and 9, the display panel 10, according to an exemplary embodiment of the present disclosure, includes the first area OA, the second area DA surrounding the first area OA, and the third area MA between the first area OA and the second area DA, each corresponding to one side of the substrate.

In this case, assuming that an edge of the first area OA is a first line E1 and a boundary between the second area DA and the third area MA is a third line E3, the third area MA may be defined as an area having a ring shape with the first line E1 and the third line E3 respectively as an inner edge and an outer edge. Also, the third area MA may be divided into two areas around a second line E2. An area of the two areas that is adjacent to the first area OA is defined as a (3-1)st area MA1, and an area of the two areas that is adjacent to the second area DA is defined as a (3-2)nd area MA2.

Pixels P are disposed around the first area OA. The pixels P may be spaced apart from each other around the first area OA. In a plan view, pixels P may be disposed up and down around the first area OA, and pixels P may be disposed left and right around the first area OA.

Some of lines applying various signals and voltages to the pixels P are disposed in the (3-2)nd area MA2, which is a ring-shaped area, with the second line E2 and the third line E3 respectively as an inner edge and an outer edge.

For example, signal lines of the lines that are adjacent to the first area OA may detour around the first area OA. Some of the data lines DL that pass across the second area DA may extend in a y-direction so as to provide a data signal to pixels P respectively disposed up and down with the first area OA therebetween, and detour along the first line E1, which is an edge of the first area OA in the (3-2)nd area MA2. Some of the scan lines SL that pass across the second area DA may extend in an x-direction so as to provide a scan signal to pixels P respectively disposed left and right with the first area OA therebetween, and detour along the first line E1, which is an edge of the first area OA in the (3-2)nd area MA2.

Meanwhile, one or more grooves G are disposed in the (3-1)st area MA1, which is a ring-shaped area with the first line E1 and the second line E2 respectively as an inner edge and an outer edge. In this case, the grooves G may be spaced apart from each other. Though it is shown in FIG. 8 that three grooves G are disposed in the (3-1)st area MA1, one, two, or four or more grooves G may be disposed in the (3-1)st area MA1.

Since the grooves G are disposed in the (3-1)st area MA1, the grooves G may be further adjacent to the first area OA than detour portions of the data lines DL and/or the scan lines SL that detour along the first line E, which is an edge of the first area OA.

In a plan view, the grooves G may have a ring shape entirely surrounding the first area OA in the (3-1)st area MA1. In a plan view, a radius of each of the grooves G from a center O of the first area OA may be greater than a radius of the first area OA. For example, assuming that a radius of the first area OA is a first radius R1 and an outer radius of the (3-1)st area MA1 is a second radius R2, a radius of each of the grooves G may be greater than the first radius R1 and less than the second radius R2.

According to an exemplary embodiment of the present disclosure, as shown in FIG. 9, the first area OA of the display panel 10 may be an area including the first opening 10H, and the grooves G may be spaced apart from the first opening 10H and may have a concave shape in a z-direction, which is a thickness direction of the substrate 100.

Referring to FIG. 9, the display panel 10 includes the first area OA, which is an opening area, the second area DA, which is a display area, and the third area MA, which is a non-display area between the first area OA and the second area DA.

For example, the pixel circuit PC on the substrate 100, a pixel electrode 221 connected to the pixel circuit PC, and an intermediate layer 222 and an opposite electrode 223 that are sequentially stacked on the pixel electrode 221 are disposed in the second area DA, which is the display area.

The substrate 100 may be a multi-layer. For example, the substrate 100 may include the first base layer 101, the first barrier layer 102, the second base layer 103, and the second barrier layer 104 that are sequentially stacked.

Each of the first and second base layers 101 and 103 may include a polymer resin. For example, the first and second base layers 101 and 103 may each include a polymer resin such as polyethersulfone (PES), polyarylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose triacetate (TAC), and/or cellulose acetate propionate (CAP). The polymer resin may be transparent.

Each of the first and second barrier layers 102 and 104 may include a barrier layer configured to prevent penetration of external substances and each layer may include a single layer or a multi-layer including an inorganic material such as $SiN_x$ and/or $SiO_x$.

The pixel circuit PC is disposed on the substrate 100 and includes a thin film transistor and a storage capacitor. An organic light-emitting diode OLED including the pixel electrode 221, an emission layer of the intermediate layer 222, and the opposite electrode 223 emits predetermined light and is covered by the thin-film encapsulation layer 300. Hereinafter, elements disposed in the second area DA are specifically described with reference to FIG. 10.

Referring to FIG. 10, the pixel circuit PC and the organic light-emitting diode OLED electrically connected to the pixel circuit PC may be disposed in the second area DA, which is the display area.

A thin film transistor TFT, a storage capacitor Cst, each disposed over the substrate 100, and the pixel electrode 221 electrically connected to the thin film transistor TFT and the storage capacitor Cst are formed. The pixel circuit PC may be disposed on the substrate 100, and the organic light-emitting diode OLED may be disposed on the pixel circuit PC.

The substrate 100 may include a polymer resin or glass. According to an exemplary embodiment of the present disclosure, the substrate 100 may include a polymer resin such as polyethersulfine (PES), polyarylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose triacetate (TAC), and/or cellulose acetate propionate (CAP). The substrate 100 may be flexible. The substrate 100 may include a glass material containing $SiO_2$ as a main component or may include a resin such as a reinforced plastic, and may be rigid. The substrate 100 may have a stacked structure including a layer including the above-described polymer resin and a barrier layer disposed on the above-described polymer resin layer. In this case, the flexibility of the substrate 100 may be improved. The barrier layer may include at least one of silicon nitride ($SiN_x$), silicon oxynitride (SiON), and silicon oxide ($SiO_x$).

A buffer layer 201 configured to prevent impurities from penetrating into a semiconductor layer Act of the thin film transistor TFT may be provided on the substrate 100. The buffer layer 201 may include an inorganic insulating material such as silicon nitride ($SiN_x$), silicon oxynitride (SiON), and silicon oxide ($SiO_x$) and may include a single layer or a multi-layer including the above-described inorganic insulating materials.

The pixel circuit PC may be disposed on the buffer layer 201. The pixel circuit PC includes the thin film transistor TFT and the storage capacitor Cst. The thin film transistor TFT may include the semiconductor layer Act, a gate electrode GE, a source electrode SE, and a drain electrode DE. The thin film transistor TFT shown in FIG. 10 may correspond to the driving thin film transistor described with reference to FIG. 7. Though the present embodiment shows a top-gate type thin film transistor in which the gate electrode GE is disposed over the semiconductor layer Act with a gate insulating layer 203 therebetween, the thin film transistor TFT may be a bottom-gate type thin film transistor according to an exemplary embodiment of the present disclosure.

The semiconductor layer Act may include polycrystalline silicon. Alternatively, the semiconductor layer Act may include amorphous silicon, an oxide semiconductor, or an organic semiconductor. The gate electrode GE may include a low resistance metal material. The gate electrode GE may include a conductive material including at least one of Mo, Al, Cu, and Ti and may include a single layer or a multi-layer including the above materials.

The gate insulating layer 203 between the semiconductor layer Act and the gate electrode GE may include an inorganic insulating material such as silicon oxide, silicon nitride, and silicon oxynitride, aluminum oxide, titanium oxide, tantalum oxide, and hafnium oxide. The gate insulating layer 203 may include a single layer or a multi-layer including the above materials.

The source electrode SE and the drain electrode DE may include a material having excellent conductivity. The source electrode SE and the drain electrode DE may include a conductive material including at least one of Mo, Al, Cu, and Ti and may include a single layer or a multi-layer including the above materials. According to an exemplary embodiment of the present disclosure, the source electrode SE and the drain electrode DE may include a multi-layer of Ti/Al/Ti. As used herein, the phrase "excellent conductivity" may mean any material having an electrical conductivity within the range of electrical conductivities set by the aforementioned conductive materials.

The storage capacitor Cst includes a lower electrode CE1 and an upper electrode CE2 that overlap each other with a first interlayer insulating layer 205 therebetween. The storage capacitor Cst may overlap the thin film transistor TFT. With regard to this, it is shown in FIG. 10 that the gate electrode GE of the thin film transistor TFT serves as the lower electrode CE1 of the storage capacitor Cst. According to an exemplary embodiment of the present disclosure, the storage capacitor Cst might not overlap the thin film transistor TFT. The storage capacitor Cst may be covered by a second interlayer insulating layer 207.

The first and second interlayer insulating layers 205 and 207 may include an inorganic insulating material such as silicon oxide, silicon nitride, and silicon oxynitride, aluminum oxide, titanium oxide, tantalum oxide, and hafnium oxide. The first and second interlayer insulating layers 205 and 207 may include a single layer or a multi-layer including the above materials.

The pixel circuit PC including the thin film transistor TFT and the storage capacitor Cst may be covered by a planarization insulating layer 209. The planarization insulating layer 209 may include an approximately flat top surface. The planarization insulating layer 209 may include an organic insulating material including a general-purpose polymer such as polymethylmethacrylate (PMMA) and polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. According to an exemplary embodiment of the present disclosure, the planarization insulating layer 209 may include polyimide. Alternatively, the planarization insulating layer 209 may include an inorganic insulating material or inorganic and organic insulating materials.

The pixel electrode 221 may be formed on the planarization insulating layer 209. The pixel electrode 221 may include a conductive oxide such as indium tin oxide (ITO), zinc oxide (IZO), zinc oxide (ZnO), indium oxide ($In_2O_3$), indium gallium oxide (IGO), or aluminum zinc oxide (AZO). According to an exemplary embodiment of the present disclosure, the pixel electrode 221 may include a reflective layer including Ag, Mg, Al, Pt, Pd, Au, Ni, Nd, Ir, Cr, and/or a compound thereof. According to an exemplary embodiment of the present disclosure, the pixel electrode 221 may further include a layer including ITO, IZO, ZnO, or $In_2O_3$ on/under the reflective layer.

A pixel-defining layer 211 may be formed on the pixel electrode 221. The pixel-defining layer 211 may include an opening that exposes a top surface of the pixel electrode 221 and cover edges of the pixel electrode 221. Alternatively, the pixel-defining layer 211 may include an inorganic insulating material such as silicon nitride (SiNx), silicon oxynitride (SiON), and silicon oxide (SiOx). Alternatively, the pixel-defining layer 211 may include an organic insulating material and an inorganic insulating material.

The intermediate layer 222 includes an emission layer 222b. The intermediate layer 222 may include a first functional layer 222a disposed under the emission layer 222b and/or a second functional layer 222c disposed on the emission layer 222b. The emission layer 222b may include a low molecular weight or polymer organic material that emits light of a predetermined color.

The first functional layer 222a may include an organic layer. The first functional layer 222a may include a single layer or a multi-layer. For example, in the case where the first functional layer 222a includes a polymer material, the first functional layer 222a includes a hole transport layer (HTL), which has a single-layered structure, and may include poly-(3,4)-ethylene-dihydroxy thiophene (PEDOT) or polyaniline (PANI). In the case where the first functional layer 222a includes a low molecular weight material, the first functional layer 222a may include a hole injection layer (HIL) and an HTL.

The second functional layer 222c may be omitted. For example, in the case where the first functional layer 222a and the emission layer 222b include a polymer material, it is preferable that the second functional layer 222c is provided. The second functional layer 222c may include a single layer or a multi-layer. The second functional layer 222c may include an electron transport layer (ETL) and/or an electron injection layer (EIL).

The emission layer 222b of the intermediate layer 222 may be disposed every pixel in the display area DA. The emission layer 222b may contact at least a portion of a top surface of the pixel electrode 221 that is exposed through the opening of the pixel-defining layer 211.

The opposite electrode 223 may include a conductive material having a low work function. For example, the opposite electrode 223 may include a transparent or semi-transparent layer including Ag, Mg, Al, Pt, Pd, Au, Ni, Nd, Ir, Cr, Li, Ca, or an alloy thereof. Alternatively, the opposite electrode 223 may further include a layer including ITO, IZO, ZnO, or $In_2O_3$ on the transparent/semi-transparent layer including the above-mentioned material. The opposite electrode 223 may be provided in not only the second area DA but also the third area MA. The intermediate layer 222 and the opposite electrode 223 may be formed by a thermal deposition method.

A capping layer 230 may be disposed on the opposite electrode 223. For example, the capping layer 230 may include LiF and may be formed by a thermal deposition method. Alternatively, the capping layer 230 may include an inorganic insulating material such as silicon oxide, silicon nitride, and/or silicon oxynitride. Alternatively, the capping layer 230 may be omitted.

A spacer 213 may be provided on the pixel-defining layer 211. The spacer 213 may include an organic insulating material such as polyimide. Alternatively, the spacer 213 may include an inorganic insulating material such as silicon nitride or silicon oxide, or include an organic insulating material and an inorganic insulating material.

The spacer 213 may include a material different from that of the pixel-defining layer 211. Alternatively, the spacer 213 may include the same material as that of the pixel-defining layer 211. In this case, the pixel-defining layer 211 and the spacer 213 may be simultaneously formed during a mask process that uses a half-tone mask, etc. According to an exemplary embodiment of the present disclosure, the pixel-defining layer 211 and the spacer 213 may include polyimide.

The organic light-emitting diode OLED is covered by the thin-film encapsulation layer 300. The thin-film encapsulation layer 300 may include at least one organic encapsulation layer and at least one inorganic encapsulation layer. According to an exemplary embodiment of the present disclosure, it is shown in FIG. 7 that the thin-film encapsulation layer 300 includes first and second inorganic encapsulation layers 310 and 330, and an organic encapsulation layer 320 therebetween. According to an exemplary embodiment of the present disclosure, the number of organic encapsulation layers, the number of inorganic encapsulation layers, and a stacking sequence may be modified.

The first and second inorganic encapsulation layers 310 and 330 may each include one or more inorganic insulating materials such as aluminum oxide, titanium oxide, tantalum oxide, hafnium oxide, zinc oxide, silicon oxide, silicon nitride, or silicon oxynitride, and may be formed by chemical vapor deposition (CVD). The organic encapsulation layer 320 may include a polymer-based material. The polymer-based material may include an acrylic-based resin, an epoxy-based resin, polyimide, and polyethylene.

The input sensing layer 40 may be disposed on the display panel 10. It is shown in FIG. 10 that the input sensing layer 40 is directly formed on the display panel 10 and contacts the thin-film encapsulation layer 300.

Referring to FIG. 9 again, the third area MA, which is a non-display area of the display panel 10, may include the (3-1)st area MA1 adjacent to the first area OA or the first opening 10H, and the (3-2)nd area MA2 adjacent to the second area DA, the first area OA being the opening area, and the second area DA being a relative display area.

The (3-2)nd area MA2 may be an area across which signal lines, for example, the data lines DL described with reference to FIG. 8 pass. The data lines DL shown in FIG. 9 may correspond to data lines detouring around the first area OA. The (3-2)nd area MA2 may be a wiring area or a detour area across which the data lines DL pass.

As shown in FIG. 9, the data lines DL may be alternately disposed with an insulating layer despised therebetween. Alternatively, the data lines DL may be disposed on the same insulating layer (e.g. the second interlayer insulating layer 207). In the case where neighboring data lines DL are respectively disposed above and below with an insulating layer (e.g. the second interlayer insulating layer 207) therebetween, a gap (pitch) between the neighboring data lines DL may be reduced and thus a width of the third area MA may be reduced.

Also, the scan lines SL detouring around the first area OA described with reference to FIG. 8 may be also disposed in the (3-2)nd area MA2. The scan lines SL may be disposed on a layer different from a layer on which the data lines DL are disposed. For example, the scan lines SL may be disposed on a layer lower than the layer on which the data lines DL are disposed.

A first electrode layer 221M is disposed over detour portions of the data and scan lines DL and SL disposed in the (3-2)nd area MA2. In this case, the first electrode layer 221M covers the detour portions of the lines DL and SL. At least one insulating layer 205, 207, and 209 may be disposed between the first electrode layer 221M and the lines DL and SL.

Referring to FIG. 8 again, the first electrode layer 221M may correspond to the entire (3-2)nd area MA2. In this case, the first electrode layer 221M may define the (3-2)nd area MA2. For example, an area of the substrate 100 in which the first electrode layer 221M is disposed may be defined as the (3-2)nd area MA2.

According to an exemplary embodiment of the present disclosure, the first electrode layer 221M may include a hole corresponding to the first area OA, and the hole may be greater than the first radius R1. For example, the first electrode layer 221M may be a pattern having a ring shape with an inner edge and an outer edge respectively corresponding to the second line E2 and the third line E3.

Therefore, the first electrode layer 221M may cover detour portions of the lines DL and SL disposed in the (3-2)nd area MA2 and might not cover the grooves G disposed in the (3-1)st area MA1.

Referring to FIGS. 8 and 9 again, a first insulating layer 211PR is disposed on the first electrode layer 221M. In this case, the first insulating layer 211PR may cover edges corresponding to the second line E2 and the third line E3 of the first electrode layer 221M.

The first insulating layer 211PR includes an opening that exposes at least a portion of the first electrode layer 221M. The opening may have a plane shape or an island shape. In the former case, the first insulating layer 211PR may include a plurality of protrusions spaced apart from each other.

A second electrode layer 223M is disposed on the first electrode layer 221M. For example, the second electrode layer 223M contacts a portion of the first electrode layer 221M that is exposed through the opening.

A constant voltage may be applied to the second electrode layer 223M. Accordingly, since the second electrode layer 223M and the first electrode layer 221M contacting the second electrode layer 223M are floated with equipotentiality, the lines DL and SL disposed below the first electrode layer 221M may be shielded.

According to an exemplary embodiment of the present disclosure, the first electrode layer 221M may include the same material as that of the pixel electrode 221 included in the pixel circuit PC. Also, the first electrode layer 221M may be disposed on the same layer on which the pixel electrode 221 is disposed.

According to an exemplary embodiment of the present disclosure, the second electrode layer 223M may include the same material as that of the opposite electrode 223 included in the pixel circuit PC. Also, the second electrode layer 223M may be disposed on the same layer on which the opposite electrode 223 is disposed and may be a portion of the opposite electrode 223.

According to an exemplary embodiment of the present disclosure, the first insulating layer 211PR may include the same material as that of the pixel-defining layer 211 included in the pixel circuit PC. Also, the first insulating layer 211PR may be disposed on the same layer on which the pixel-defining layer 211 is disposed.

The (3-1)st area MA1 is a kind of groove area in which the grooves are disposed. Though it is shown in FIGS. 8 and 9 that three grooves G are disposed in the (3-1)st area MA1, the number of grooves G may be variously modified as described above.

Each of the grooves G may be formed in a multi-layer including a first layer and a second layer respectively including different materials. According to an exemplary embodiment of the present disclosure, it is shown in FIG. 9 that the groove G is formed in a sub-layer provided in the substrate 100.

The groove G may be formed by removing a portion of the second barrier layer 104 and a portion of the second base layer 103. In this case, the groove G may be formed before a process of forming the intermediate layer 222.

According to an exemplary embodiment of the present disclosure, a portion of the intermediate layer 222, for example, the first and/or second functional layers 222a and 222c (see FIG. 10) extending to the third area MA may be disconnected around the groove G. Therefore, external moisture that has penetrated through the first opening 10H may be prevented from progressing to the organic light-emitting diode OLED of the second area DA, which is the display area, through the organic encapsulation layer 320.

In the case where the first and second functional layers 222a and 222c (see FIG. 10) are disconnected around the groove G, unlike the emission layer 222b (see FIG. 10), there may be the first and second functional layers 222a and 222c (see FIG. 10) not only in the second area DA, which is the display area of FIG. 9, but also in the third area MA, which is the non-display area.

According to an exemplary embodiment of the present disclosure, the first and second functional layers 222a and 222c (see FIG. 10), which are portions of the intermediate layer 222, may be removed from the third area MA, which is the non-display area, or the first and second functional layers 222a and 222c may be disposed exclusively within the second area DA, which is the display area, initially. In this case, the groove G configured to prevent moisture penetration may be omitted.

Hereinafter, the case where the first and second functional layers 222a and 222c (see FIG. 10) are in the third area MA and the case where the first and second functional layers 222a and 222c (see FIG. 10) are not in the third area MA are described in greater detail with reference to FIGS. 11A and 11B.

Figure 11A:
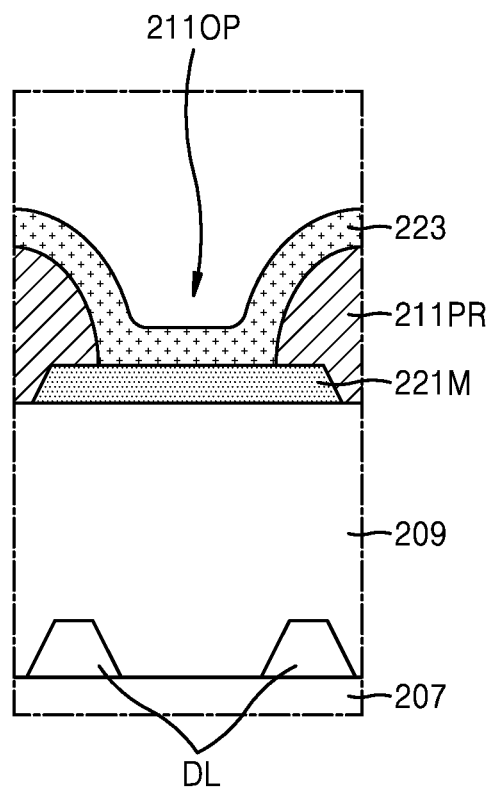
FIGS. 11A and 11B are enlarged cross-sectional views illustrating region XI of FIG. 9.
Figure 11B:
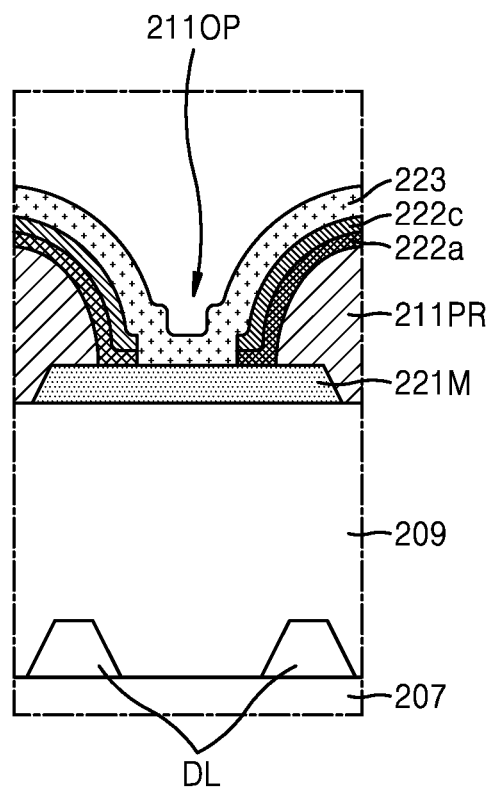

FIGS. 11A and 11B are enlarged cross-sectional views of region XI of FIG. 9.

First, FIG. 11A shows the case where the first and second functional layers 222a and 222c, which are portions of the intermediate layer 222 (see FIG. 9) are not in the third area MA.

Referring to FIG. 11A, the first electrode layer 221M is disposed over a portion of a line disposed in the third area MA, for example, a detour portion (see FIG. 8) of the data line DL. In this case, the first insulating layer 211PR having an opening 211OP that exposes a portion of the first electrode layer 221M may be disposed on the first electrode layer 221M, and the second electrode 223 may be disposed on the first insulating layer 211PR.

In this case, since there is not a mediation layer such as the first and second functional layers 222a and 222c between the second electrode layer 223M (disposed on the same layer on which the opposite electrode 223 of FIG. 9 is disposed) and the first electrode layer 221M (disposed on the same layer on which the pixel electrode 221 of FIG. 9 is disposed), the second electrode layer 223M may directly contact the first electrode layer 221M.

Next, FIG. 11B shows the case where there are the first and second functional layers 222a and 222c, which are portions of the intermediate layer 222 (see FIG. 9), in the third area MA.

Referring to FIG. 11B, like FIG. 11A, the first electrode layer 221M is disposed over a portion of a line disposed in the third area MA, for example, the detour portion (see FIG. 8) of the data line DL. In this case, the first insulating layer 211PR having the opening 211OOP that exposes a portion of the first electrode layer 221M may be disposed on the first electrode layer 221M.

Meanwhile, unlike FIG. 11A, the first and second functional layers 222a and 222c, which are portions of the intermediate layer 222 (see FIG. 9), are disposed on the first insulating layer 211PR, and the second electrode layer 223M may be disposed on the first and second functional layers 222a and 222c.

In this case, since there is a mediation layer such as the first and second functional layers 222a and 222c between the second electrode layer 223M and the first electrode layer 221M, the second electrode layer 223M cannot directly contact the first electrode layer 221M.

Therefore, after selectively removing portions of the first and second functional layers 222a and 222c by using a laser beam, etc. and exposing a portion of the first electrode layer 221M to the outside within the opening 211OP of the first insulating layer 211PR, the second electrode layer 223M may be allowed to directly contact the first electrode layer 221M.

Hereinafter, a planar structure of display panels 10A, 10B, and IOC including the first electrode layer 221M, the first insulating layer 211PR, and the second electrode layer 223M is described in greater detail with reference to FIGS. 12A to 14B.

Figure 12A:
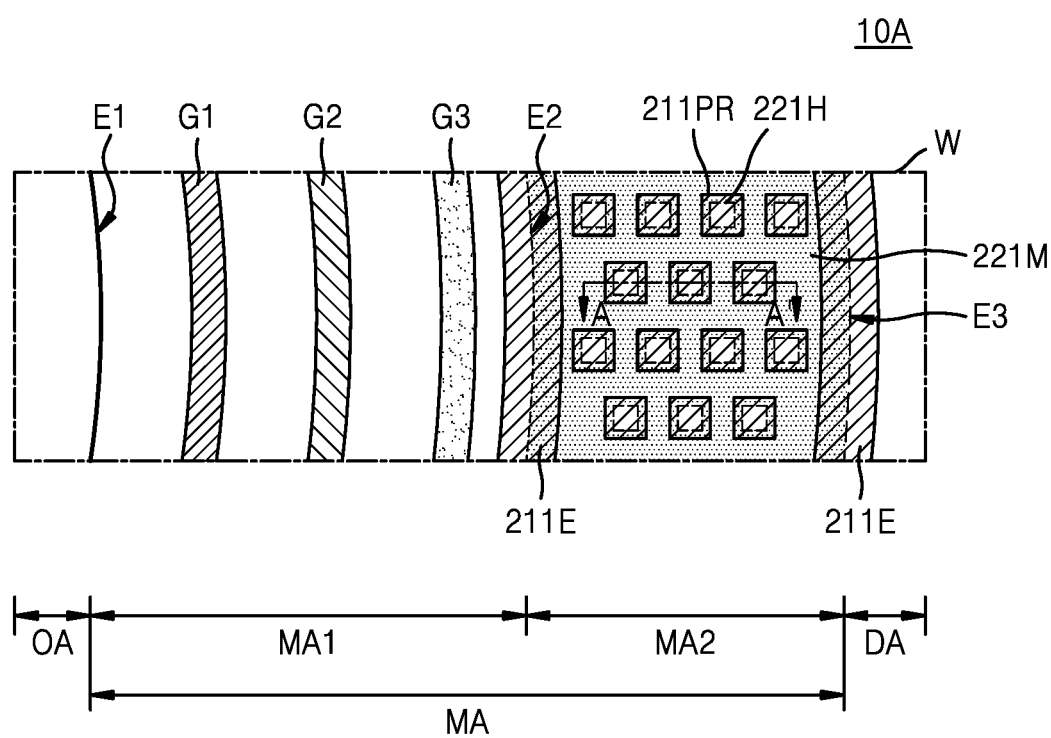
FIG. 12A is an enlarged plan view illustrating an example of region W of FIG. 8.
Figure 12B:
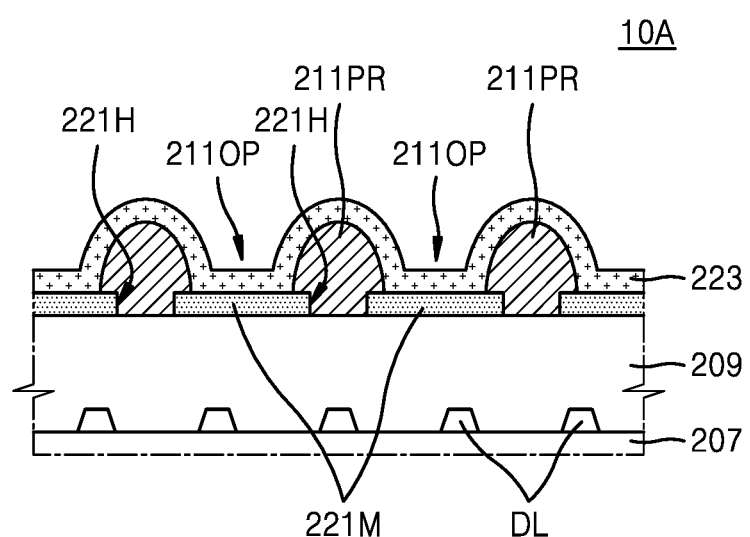
FIG. 12B is a cross-sectional view taken along line A-A' of FIG. 12A.

FIG. 12A is an enlarged plan view of an example of region W of FIG. 8, and FIG. 12B is a cross-sectional view taken along line A-A' of FIG. 12A.

Referring to FIGS. 12A and 12B, the first electrode layer 221M may include a plurality of holes 221H. Since the planarization insulating layer 209, which is an organic insulating layer, is disposed under the first electrode layer 221M, a kind of vent hole is formed in the first electrode layer 221M, which is a layer disposed on the planarization insulating layer 209, so as to perform out-gasing of the planarization insulating layer 209.

However, since a cross-section of the first electrode layer 221M is exposed to the outside through the plurality of holes 221H of the first electrode layer 221M, metal such as Ag may be precipitated on the first electrode layer 221M during a process. Therefore, the plurality of holes 221H may be covered by the first insulating layer 211PR such that the cross-section of the first electrode layer 221M is not exposed.

The plurality of holes 221H of the first electrode layer 221M may be spaced apart from each other and thus the first insulating layer 211PR covering each of the plurality of holes 221H may also include protrusions spaced apart from each other.

According to an exemplary embodiment of the present disclosure, the plurality of holes 221H may be alternatively disposed. Here, the alternate arrangement means that in the case where the plurality of holes 221H include first holes disposed on one row, second holes disposed on another row, and third holes adjacent to the first holes and the second holes and disposed on a row different from the above rows, the third holes are disposed between the first holes and the second holes.

Also, edges of the first electrode layer 221M corresponding to the second line E2 and the third line E3 may be portions through which the cross-section of the first electrode layer 221M is exposed. Therefore, the edges of the first electrode layer 221M may be covered by a cover member 211E including the same material as that of the first insulating layer 211PR.

Unlike the first electrode layer 221M including the protrusions, the cover member 211E may have a strip shape extending lengthwise and thus an edge of the cover member 211E that faces the first area OA is disposed more closely to the first area OA than the second line E2 corresponding to an edge of the first electrode layer 221M. Likewise, an edge of the cover member 211E that faces the second area DA is disposed more closely to the second area DA than the third line E3 corresponding to an edge of the first electrode layer 221M.

Meanwhile, to cover each of the plurality of holes 221H of the first electrode layer 221M, the first insulating layer 211PR may include a plurality of protrusions respectively corresponding to the plurality of holes 221H as shown in FIG. 12B.

According to an exemplary embodiment of the present disclosure, a cross-section of the protrusions of the first insulating layer 211PR respectively covering the plurality of holes 221H may have the same shape as that of the plurality of holes 221H.

Meanwhile, though it is shown in FIG. 12A that the plurality of holes 221H are quadrangular holes, the shape thereof may be a circular shape, an elliptical shape, or a triangular shape and may be variously modified.

The second electrode layer 223M is disposed on the protrusions and contacts portions of the first electrode layer 221M that are not covered by the protrusions. Therefore, the first electrode layer 221M may have the same voltage level as that of the second electrode layer 223M and shield the data lines DL, etc. disposed below the first electrode layer 221M.

Figure 13A:
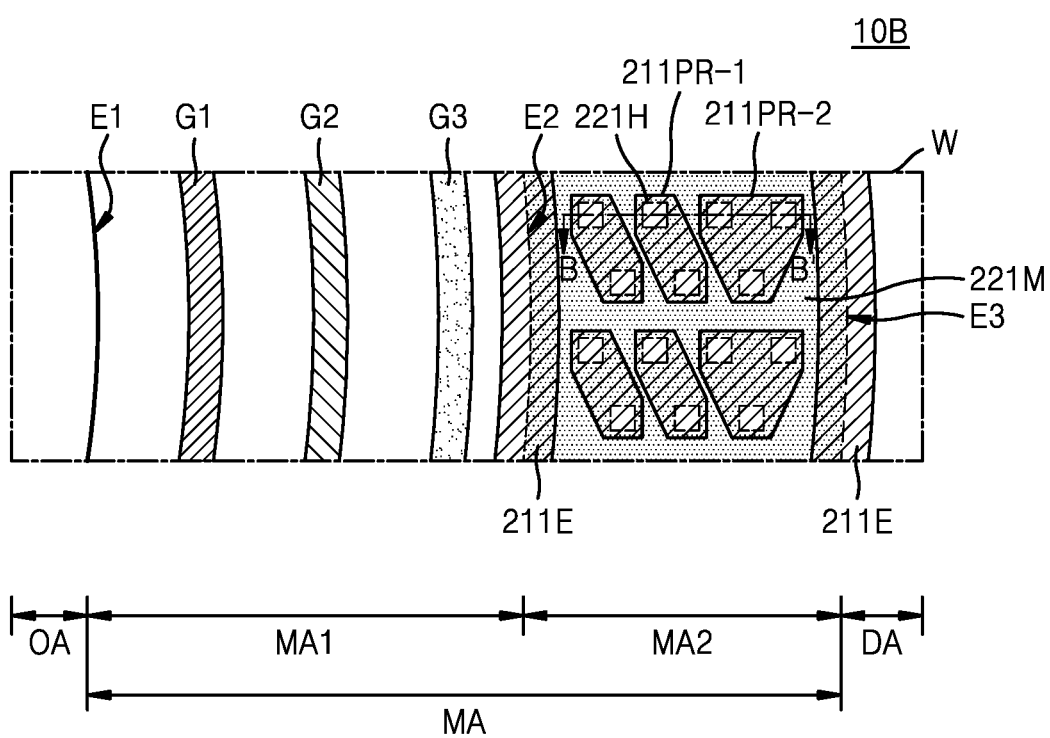
FIG. 13A is an enlarged plan view illustrating an example of region W of FIG. 8.
Figure 13B:
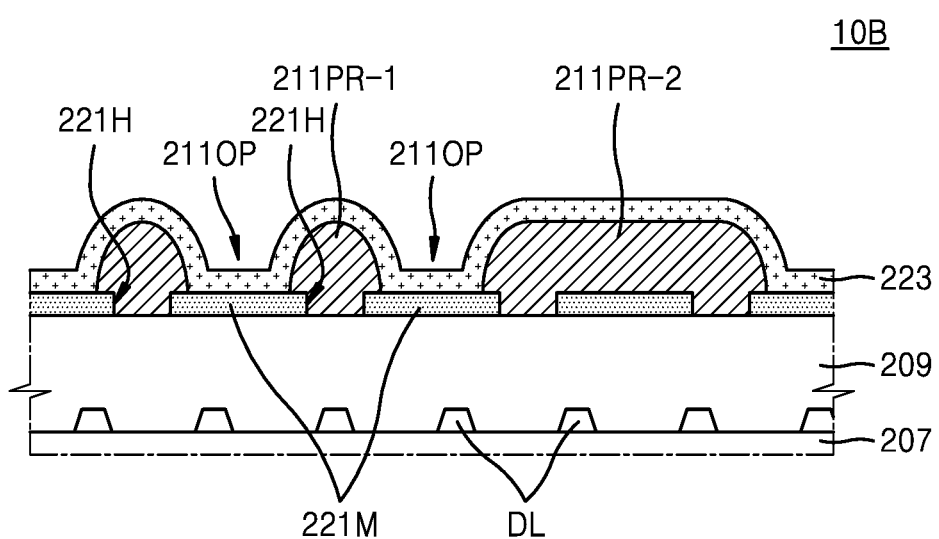
FIG. 13B is a cross-sectional view taken along line B-B' of FIG. 13A.

FIG. 13A is an enlarged plan view of an example of region W of FIG. 8, and FIG. 13B is a cross-sectional view taken along line B-B' of FIG. 13A.

Hereinafter, differences between the arrangement described with reference to FIGS. 12A and 12B are mainly described and it may be assumed that features that are not now discussed may be at least similar to corresponding features that have already been described.

Referring to FIGS. 13A and 13B, the first insulating layer 211PR may cover at least two neighboring holes 221H as one set among the plurality of holes 221H of the first electrode layer 221M.

In this case, the first insulating layer 211PR may include protrusions spaced apart from each other but the protrusions may be larger than the protrusions shown in FIGS. 12A and 12B.

Since the first insulating layer 211PR covers at least two holes 221H and includes the protrusions spaced apart from each other, a contact area or a contact frequency between the second electrode layer 223M and the first electrode layer 221M may be reduced as shown in FIG. 13B, but a time taken for a process of covering the plurality of holes 221H by using the first insulating layer 211PR may be reduced.

Figure 14A:
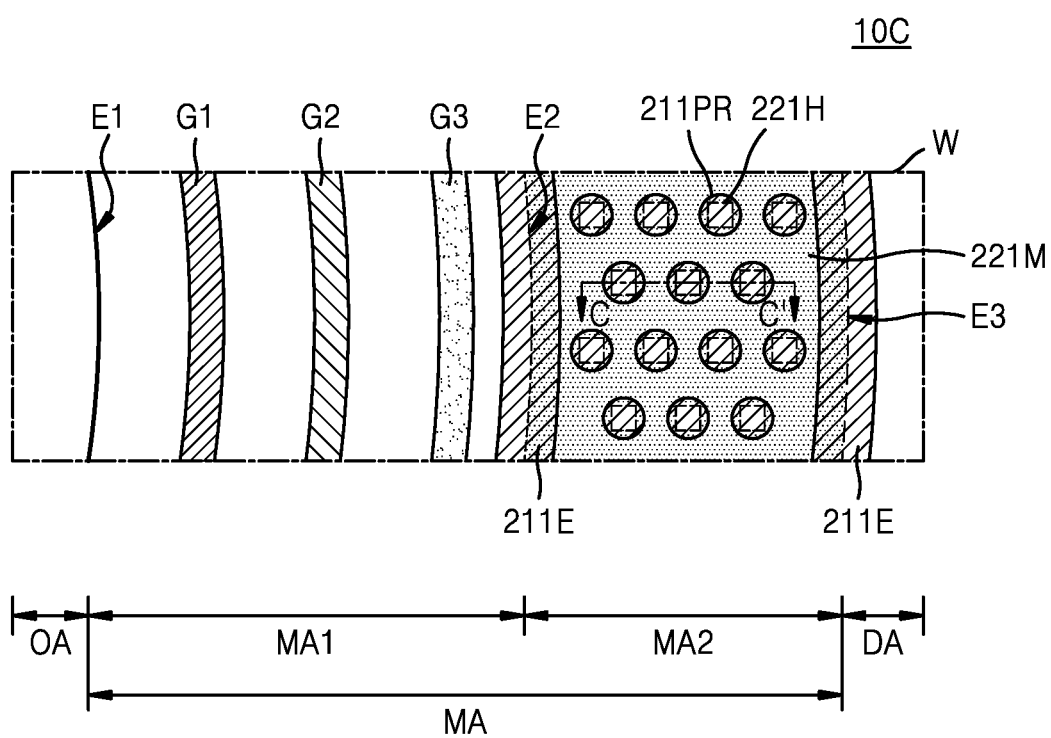
FIG. 14A is an enlarged plan view illustrating an example of region W of FIG. 8.
Figure 14B:
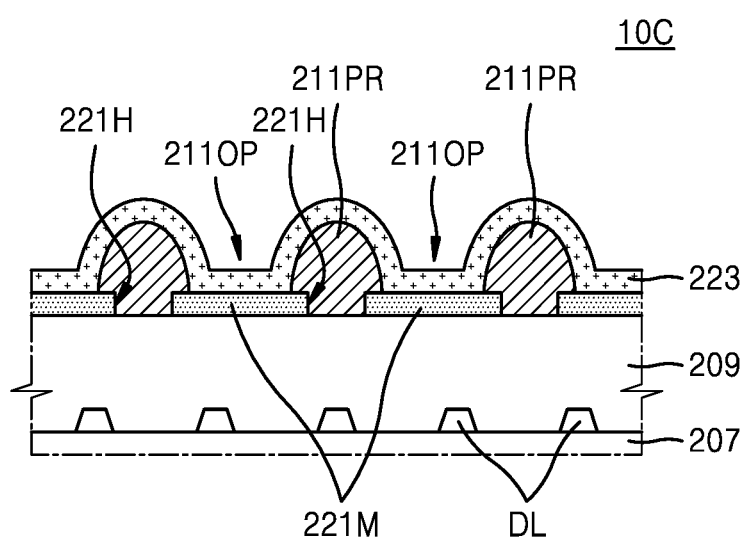
FIG. 14B is a cross-sectional view taken along line C-C' of FIG. 4A.

FIG. 14A is an enlarged plan view of an example of region W of FIG. 8, and FIG. 14B is a cross-sectional view taken along line C-C' of FIG. 4A.

Hereinafter, differences between the arrangement described with reference to FIGS. 12A and 12B are mainly described and it may be assumed that features that are not now discussed may be at least similar to corresponding features that have already been described.

Referring to FIGS. 14A and 14B, the first insulating layer 211PR may include a plurality of protrusions respectively covering the plurality of holes 221H of the first electrode layer 221M.

However, a cross-section of the protrusions of the first insulating layer 211PR may have a shape different from that of the plurality of holes 221H. According to an exemplary embodiment of the present disclosure, the plurality of holes 221H may be quadrangular holes but the cross-section of the protrusions may be circular.

Since the first insulating layer 211PR includes the protrusions having a shape different from that of the plurality of holes 221H as described above, an overlapping area between the protrusion of the first insulating layer 211PR and the hole 221H of the first electrode layer 221M is reduced as shown in FIG. 14A, and a contact area between the second electrode 223M and the first electrode layer 221M may be increased.

As described above, the display panel according to an exemplary embodiment of the present disclosure may easily shield wirings around the first area corresponding to an electronic element such as a sensor or a camera and simplify the arrangement of the wirings.

However, the scope of the present disclosure is not limited by this effect.

Although the disclosure has been described with reference to exemplary embodiments of the present disclosure illustrated in the drawings, this is merely provided as an example and it will be understood by those of ordinary skill in the art that various changes in form and details and equivalents thereof may be made therein without departing from the spirit and scope of the disclosure as defined by the following claims.

What is claimed is:

1. A display panel, comprising:
a substrate including a first area, a second area at least partially surrounding the first area in a plan view, and a third area disposed between the first area and the second area in the plan view;
a plurality of display elements disposed in the second area;
a plurality of wirings detouring around an edge of the first area in the third area in the plan view;
a first electrode layer covering at least a portion of the plurality of wirings; and
a second electrode layer disposed over the first electrode layer,
wherein the first area is a transmission area and is inside the second area,
wherein in the third area, the first electrode layer includes a plurality of holes that are spaced apart from each other and the second electrode layer contacts the first electrode layer between neighboring holes of the plurality of holes, and
wherein in the third area, the plurality of wirings is disposed below a region in which the first electrode layer directly contacts the second electrode layer in a cross-sectional view.

2. The display panel of claim 1, further comprising:
a first insulating layer disposed between the first electrode layer and the second electrode layer and including an opening that exposes at least a portion of the first electrode layer,
wherein the second electrode layer contacts the first electrode layer through the opening of the first insulating layer.

3. The display panel of claim 2, wherein the first insulating layer comprises a plurality of protrusions respectively covering the plurality of holes and spaced apart from each other.

4. The display panel of claim 3, wherein the plurality of protrusions include a same material as the first insulating layer.

5. The display panel of claim 1, wherein the first electrode layer includes a hole corresponding to the first area.

6. The display panel of claim 1, wherein the first electrode layer has a constant voltage.

7. The display panel of claim 1, wherein each of the plurality of display elements includes a pixel electrode, an opposite electrode, and an emission layer disposed therebetween.

8. The display panel of claim 7, wherein the first electrode layer includes a same material as the pixel electrode.

9. The display panel of claim 7, wherein the first electrode layer is disposed on a same layer as the pixel electrode.

10. The display panel of claim 9, further comprising: a second insulating layer disposed under both the first electrode layer and the pixel electrode and including an organic insulating material.

11. The display panel of claim 7, wherein the second electrode layer includes a same material as the opposite electrode.

12. The display panel of claim 1, wherein the plurality of wirings include:
a plurality of data lines extending in a first direction and is configured to apply a data signal to the plurality of display elements; and
a plurality of scan lines extending in a second direction that intersects with the first direction and is configured to apply a scan signal to the plurality of display elements.

13. A display panel, comprising:
a substrate including a first area, a second area at least partially surrounding the first area in a plan view, and a third area disposed between the first area and the second area in the plan view;
a plurality of display elements, each disposed in the second area and including a pixel electrode, an opposite electrode, and an emission layer disposed between the pixel electrode and the opposite electrode;
a plurality of wirings detouring around an edge of the first area in the third area in the plan view;
at least one groove disposed in the third area;
a first electrode layer covering at least a portion of the plurality of wirings; and
a second electrode layer disposed over the first electrode layer,
wherein the first area is a transmission area and is inside the second area,
wherein in the third area, the first electrode layer includes a plurality of holes that are spaced apart from each other and the second electrode layer contacts the first electrode layer between neighboring holes of the plurality of holes, and wherein in the third area, the plurality of wirings is disposed below a region in which the first electrode layer directly contacts the second electrode layer in a cross-sectional view.

14. The display panel of claim 13, wherein the at least one groove is closer to the first area than is the plurality of wirings.

15. The display panel of claim 13, wherein the groove is disposed between the first area and a first edge of the first electrode layer, the first edge being adjacent to the first area.

16. The display panel of claim 13, wherein the first electrode layer has a same voltage level as the opposite electrode.

17. The display panel of claim 13, wherein the first electrode layer includes a same material as the pixel electrode, and the second electrode layer includes a same material as the opposite electrode.

18. The display panel of claim 13, further comprising: an organic insulating layer disposed under the first electrode layer.

19. The display panel of claim 18, further comprising: a plurality of protrusions respectively covering the plurality of holes.

20. The display panel of claim 13, further comprising: an encapsulation layer covering the plurality of display elements and including an inorganic encapsulation layer and an organic encapsulation layer.

21. The display panel of claim 3, wherein each of the plurality of protrusions of the first insulating layer have a shape that is different from that of each of the plurality of holes of the first electrode layer.

22. The display panel of claim 1, further comprising: a cover member covering edges of the first electrode layer.

23. The display panel of claim 22, wherein the cover member includes a same material as the first insulating layer.

* * * * *